United States Patent

Watanabe et al.

[11] Patent Number: 5,883,550
[45] Date of Patent: Mar. 16, 1999

[54] CRYSTAL OSCILLATOR WITH A TEMPERATURE-COMPENSATING ANALOG CIRCUIT

[75] Inventors: Shigemitsu Watanabe; Hiromi Katoh, both of Atsugi, Japan

[73] Assignee: Mitsumi Electric Co., Ltd., Tokyo, Japan

[21] Appl. No.: 839,657

[22] Filed: Apr. 15, 1997

[30]  Foreign Application Priority Data

Apr. 15, 1996 [JP] Japan ................................. 8-092251
Oct. 31, 1996 [JP] Japan ................................. 8-289559

[51] Int. Cl.$^6$ ................................................ H03B 5/32
[52] U.S. Cl. ..................... 331/176; 331/158; 331/116 R; 331/66; 331/177 V
[58] Field of Search ............................... 331/176, 177 V, 331/158, 66, 116 R

[56]  References Cited

U.S. PATENT DOCUMENTS 5,473,289 12/1995 Ishizaki et al. ....................... 331/176

*Primary Examiner*—Arnold Kinkead
*Attorney, Agent, or Firm*—Frishauf, Holtz, Goodman, Langer & Chick

[57]  ABSTRACT

A temperature-compensated quartz oscillator comprises a stabilized power supply circuit (1) for supplying a constant voltage, an oscillation circuit (2) comprising a quartz resonator (21) and a varicap (22), a temperature detecting circuit (3) for producing a detected voltage signal ($V_{Temp}$) corresponding to an oscillator part temperature by the use of the temperature-voltage characteristic of a temperature detecting element located in the vicinity of the oscillation circuit (2), and a temperature characteristic compensating portion (4) for producing through analog processing of the detected voltage signal ($V_{Temp}$) a varicap control voltage signal ($V_{VR}$) to be supplied to the varicap (22).

21 Claims, 33 Drawing Sheets

CRYSTAL OSCILLATOR WITH A TEMPERATURE-COMPENSATING ANALOG CIRCUIT

BACKGROUND OF THE INVENTION

This invention relates to a temperature-compensated crystal oscillator (TCXO) and in particular, to such an oscillator having temperature compensating circuit especially adaptable for a reference clock of a communication apparatus which is strictly required to be stable against temperature variation.

A crystal oscillator uses, as a resonator, a piezoelectric crystal element and usually oscillates at a natural resonant frequency of the crystal element. As materials for the crystal element, there have been known quartz, Rochelle salt (potassium sodium tartrate $NaKC_4H_3O_6$), ADP (ammonium diphosphate $NH_4H_2PO_4$), KDP (potassium dihydrogen phosphate $KH_2PO_4$) and other piezo electric crystal materials. Since a typical material is quartz, the following description will be made as regards as a quartz oscillator. However, the description can be applied to other oscillator using, as a crystal element, any one of the other piezoelectric crystal materials.

The quartz oscillator is well known in the prior art as an oscillator which is excellent in oscillation frequency stability.

Recently, a typical use of the quartz oscillator is an oscillator for a reference clock in a digital communication apparatus such as a digital cellular telephone or a GPS (Global Positioning System) receiver. In the application, a frequency fluctuation or deviation ratio of an oscillation frequency must be suppressed within the limits of about ±2 ppm, at most ±3 ppm (parts per million). The deviation ratio is a ratio of a deviation in oscillation frequency to a predetermined oscillation frequency.

The quartz oscillator of the type has an AT-cut quartz resonator as the crystal element. The AT-cut quartz resonator has a frequency-temperature response where the natural resonant frequency varies in response to variation of circumferential or ambient temperature as shown in FIG. 1. The frequency-temperature response will often be referred to as the temperature-frequency variation characteristic or simply be referred to as a temperature characteristic. Specifically, the AT-cut quartz resonator has a natural resonant frequency as a center frequency of oscillation. It is noted here that the oscillation frequency of the quartz oscillator is determined by and substantially equal to the natural resonant frequency of the AT-cut quartz resonator. The natural resonant frequency has a different value in dependence upon an ambient temperature. In particular, the AT-cut quartz resonator has a predetermined natural resonant frequency corresponding to a predetermined temperature (typically, the room temperature). Let the natural resonant frequency and the predetermined natural resonant frequency be represented by f and f0, respectively. A deviation between the natural resonant frequency f and the predetermined natural resonant frequency f0 is represented by $\Delta f$ (=f−f0). A frequency deviation ratio is defined as a ratio $\Delta f/f0$ of the deviation $\Delta f$ to the predetermined natural resonant frequency f0. Then, the temperature-frequency variation characteristic of the AT-cut quartz resonator can be expressed as a variation of the frequency deviation ratio $\Delta f/f0$ in response to the temperature variation. In FIG. 1, the temperature-frequency variation characteristic is represented by a plurality of cubic curves each of which has a positive cubic coefficient with an inflection point at the predetermined temperature. The respective curves in FIG. 1 correspond to a plurality of quartz resonators cut out at different cutting angles offset from an AT-cut center angle (35° 0'15") by −2' to +16' at every 2' interval.

As seen from FIG. 1, even if the AT-cut quartz resonator has a relatively small temperature dependency, it is extremely difficult to suppress the frequency deviation ratio within a range of ±5 ppm as far as no temperature compensation is carried out. As a result, it is difficult to achieve an excellent frequency stability in the quartz oscillator using the AT-cut quartz resonator.

As described in the beginning, in order to use the quartz oscillator as the reference clock in the digital communication apparatus of the type, the frequency deviation ratio must fall within the limits of about ±2 ppm, at most ±3 ppm, throughout an operation temperature range. It is therefore required to compensate such temperature-dependent frequency variation.

In view of the above, proposal has been made of two types of temperature-compensated quartz oscillators each comprising an AT-cut quartz resonator. A first one is known as a direct compensation type while a second one is referred to as an indirect compensation type.

Referring to FIG. 2, the temperature-compensated quartz oscillator of a direct compensation type comprises an oscillation circuit including the quartz resonator, and a temperature compensating circuit comprising a temperature detecting element such as thermistors (temperature sensitive resistance elements), resistor, and capacitors. The temperature characteristic of the oscillation circuit is controlled by directly utilizing temperature characteristics of the temperature detecting elements.

Generally, most of commercially available temperature-compensated quartz oscillators are of the above-mentioned direct compensation type.

On the other hand, the temperature-compensated quartz oscillator of an indirect compensation type has a temperature detecting element separate from the oscillation circuit. One of load capacitances in the oscillation circuit is used as a temperature compensating element. The oscillation circuit has a known capacitance-frequency variation characteristic. The load capacitance as the temperature compensating element is implemented by a variable-capacitance diode, a varactor diode, or varicap of a voltage-controlled type. The varicap is applied with a varicap control voltage. By varying the varicap control voltage, the load capacitance is controllably changed. Thus, an overall capacitance of the oscillation circuit is changed to thereby control the oscillation frequency of the oscillation circuit.

In the temperature-compensated quartz oscillator of an indirect compensation type, control is typically carried out by digital operation. Such temperature-compensated quartz oscillator is illustrated in FIG. 3.

Referring to FIG. 3, the temperature-compensated quartz oscillator of an indirect compensation type using digital operation comprises a temperature detecting oscillation circuit with a quartz resonator having a frequency-temperature characteristic preliminarily measured, a frequency counter for frequency measurement, an A/D converter, an EPROM, a D/A converter, and an oscillator circuit.

The EPROM stores frequency-temperature characteristic data of the temperature detecting oscillation circuit, and temperature-voltage conversion data for obtaining the varicap control voltage in correspondence to the temperature characteristic of the output oscillation circuit preliminarily measured.

In the temperature-compensated quartz oscillator of an indirect compensation type using digital operation and having the above-mentioned structure, the varicap control voltage is extracted from the oscillation frequency of the temperature detecting oscillation circuit with reference to the data stored in the EPROM. The varicap control voltage is applied to the varicap to adjust the capacitance of the varicap. Thus, the oscillation frequency of the output oscillation circuit is controlled.

The above-described temperature-compensated quartz oscillator using digital operation in temperature compensation is called DTCXO (digital TCXO). For use in ultra-high-accuracy applications such as a reference oscillator in a base station of a digital communication system or in a high-accuracy measurement apparatus, the DTCXO having a frequency deviation ratio not higher than 0.1 ppm is commercially available.

However, each of the temperature-compensated quartz oscillators of the above-mentioned two types has various problems which will hereafter be described.

Specifically, in the temperature-compensated quartz oscillator of a direct compensation type, it is necessary to combine the resistors, the thermistors, and the capacitors for use in the oscillation circuit, very carefully checking their temperature characteristics. Otherwise, the frequency deviation ratio of the oscillation circuit can not be suppressed within the desired limits of about ±3 ppm.

However, a high cost is resulted from assembly of those components very carefully checking their temperature characteristics one by one in an actual mass-production process. Sometimes, it is difficult to obtain those components having a desired combination of the temperature characteristics. Thus, reduction in cost and easy mass production are difficult to achieve.

On the other hand, the DTCXO requires two quartz oscillation circuits (the temperature detecting oscillation circuit and the output oscillation circuit) so that the number of the components is increased and that the manufacturing process becomes complicated.

In addition, the temperature-compensated quartz oscillator of an indirect compensation type comprises expensive components such as the EPROM, an IC for digital operation, the A/D converter, and the D/A converter.

Furthermore, as illustrated in FIG. 4, compensation is carried out with respect to discrete or discontinuous temperature points specified in the data stored in the EPROM. Specifically, each temperature point is a central control value of each temperature zone having a temperature step width. Therefore, the temperature-frequency variation characteristic is plotted as shown in FIG. 5. As seen from the figure, discontinuity occurs between adjacent temperature zones.

In order to remove the discontinuity, it is proposed to change the temperature step width of each temperature zone. Specifically, in a temperature zone exhibiting a large variation of the oscillation frequency, the temperature step width is narrowed. On the other hand, in a temperature zone exhibiting a small variation of the oscillation frequency, the temperature step width is widened.

The above-mentioned approach, however, results in further increase in cost. In any event, the problems are still left unsolved.

SUMMARY OF THE INVENTION

It is therefore an object of this invention to provide a temperature-compensated crystal oscillator which is for use in a communication apparatus such as a public digital communication apparatus, which has a sufficiently high accuracy, which is operable at a low voltage (3V) corresponding to two dry cells, which is small in size and low in cost, and which can be mass-produced.

It is another object of this invention to provide a temperature-compensated quartz oscillator of the above-mentioned type, which allows easy adjustment of fluctuation in characteristics of various components after completion of circuit design.

According to this invention, there is provided a crystal oscillator of a temperature compensating type comprising: an oscillator circuit comprising a crystal element having a natural resonant frequency varying in dependence of a temperature, and a varicap diode having a variable capacitance controlled by a varicap control voltage level of a varicap control signal applied thereto, the oscillator circuit oscillating at an oscillating frequency generally determined by the natural resonant frequency and controlled by the varicap diode; a temperature detecting circuit comprising a temperature sensor disposed in the vicinity of the oscillator circuit, the temperature detecting circuit detecting, as an oscillation temperature, a temperature circumferential of the oscillator circuit to produce, as a detected voltage signal, a voltage signal with a voltage level, as a detection voltage level, dependent on the oscillation temperature; and a temperature compensating analog circuit for analog-processing the detected voltage signal to produce the varicap control signal having the varicap control voltage level determined according to the detected voltage level, the varicap control signal being applied to the varicap diode to thereby control the variable capacitance to maintain the oscillating frequency stable against variation of the oscillation temperature.

DESCRIPTION OF THE PREFERRED EMBODIMENTS

In order to facilitate an understanding of this invention, description will at first be made about the principle of temperature compensation of a quartz resonator in this invention.

Figure 1:
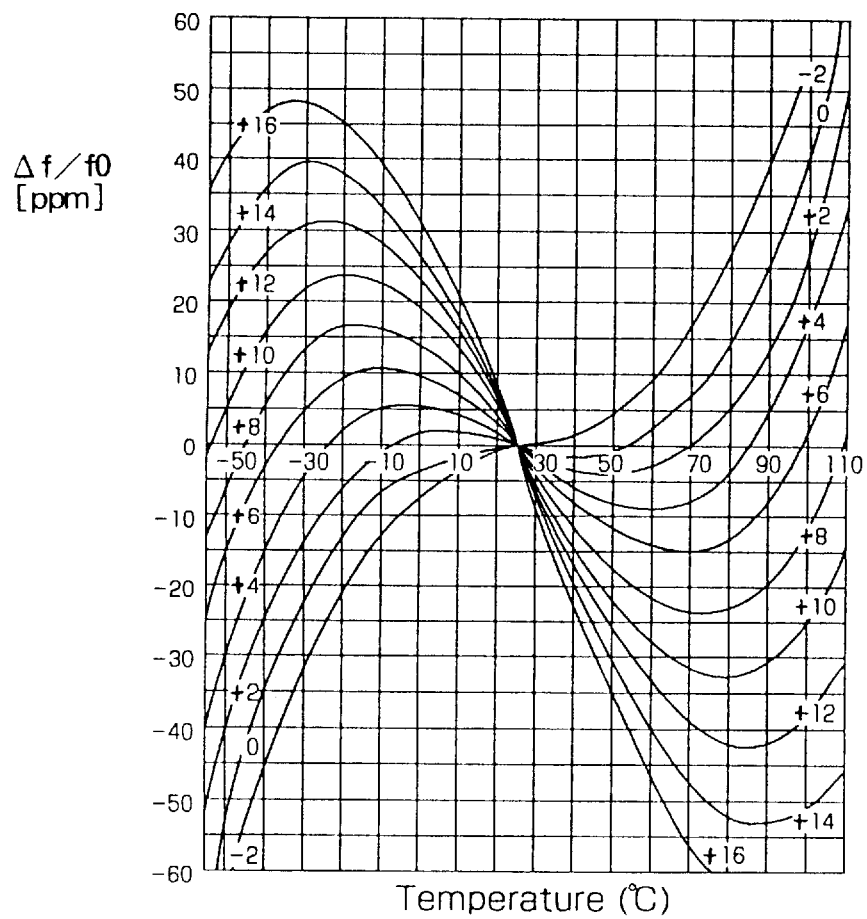
FIG. 1 is a view showing temperature-frequency characteristics of AT-cut quartz resonators having principal surfaces cut out at various cutting angles.
Figure 2:
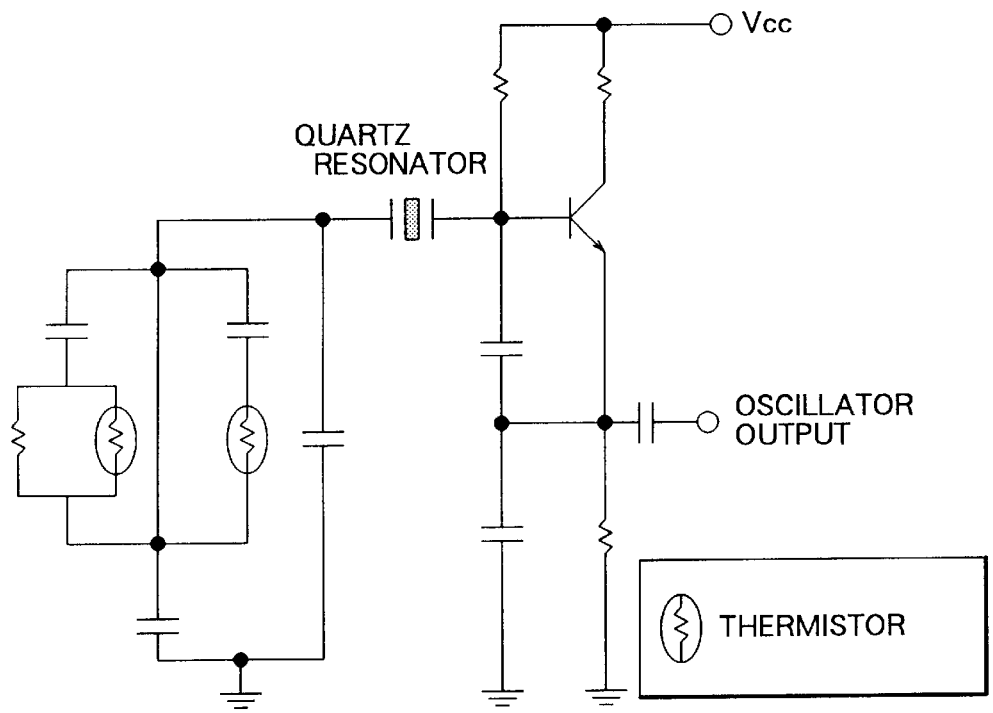
FIG. 2 shows a structure of a conventional temperature-compensated quartz oscillator of a direct compensation type.
Figure 3:
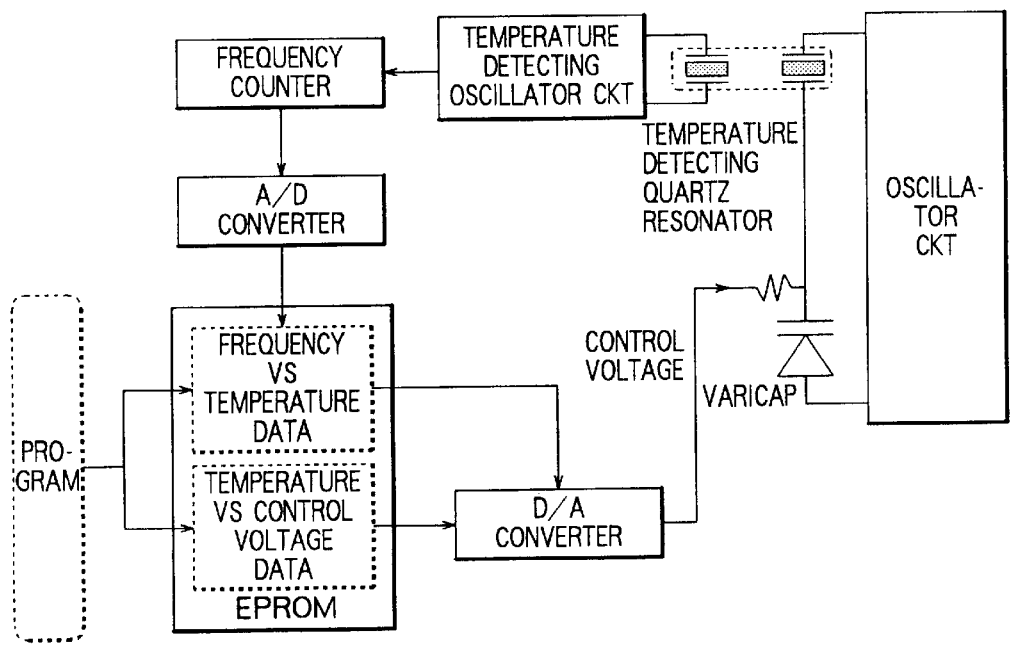
FIG. 3 is a block diagram of a structure of a conventional temperature-compensated quartz oscillator of an indirect compensation type.
Figure 4:
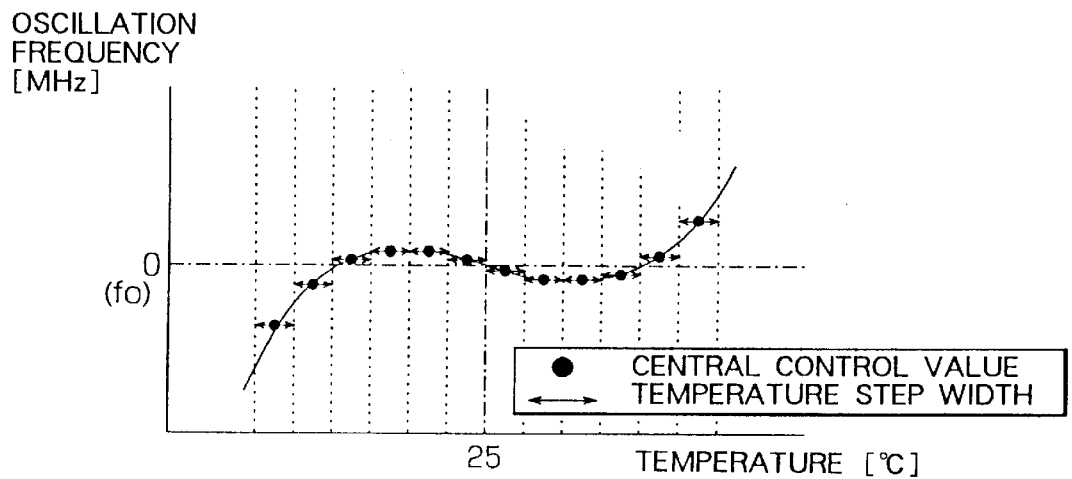
FIG. 4 is a view for describing an operation of the temperature-compensated quartz oscillator of an indirect compensation type illustrated in FIG. 3.
Figure 5:
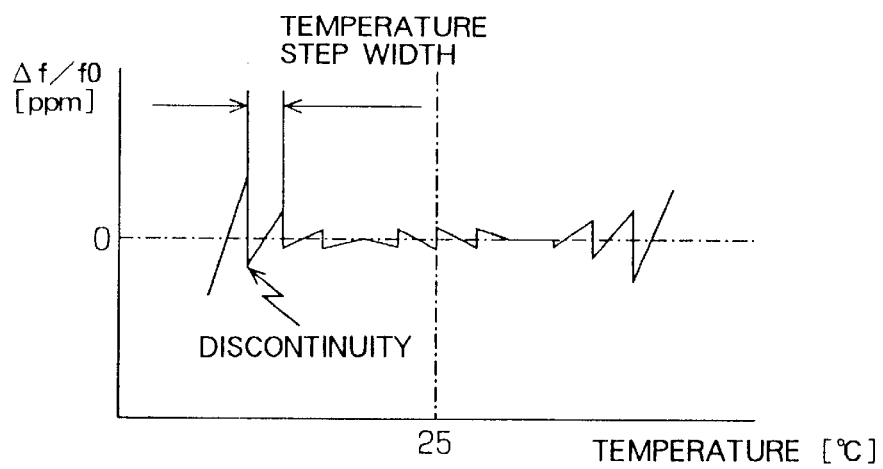
FIG. 5 is a view for describing a disadvantage in the conventional temperature-compensated quartz oscillator of an indirect compensation type illustrated in FIG. 3.
Figure 6:
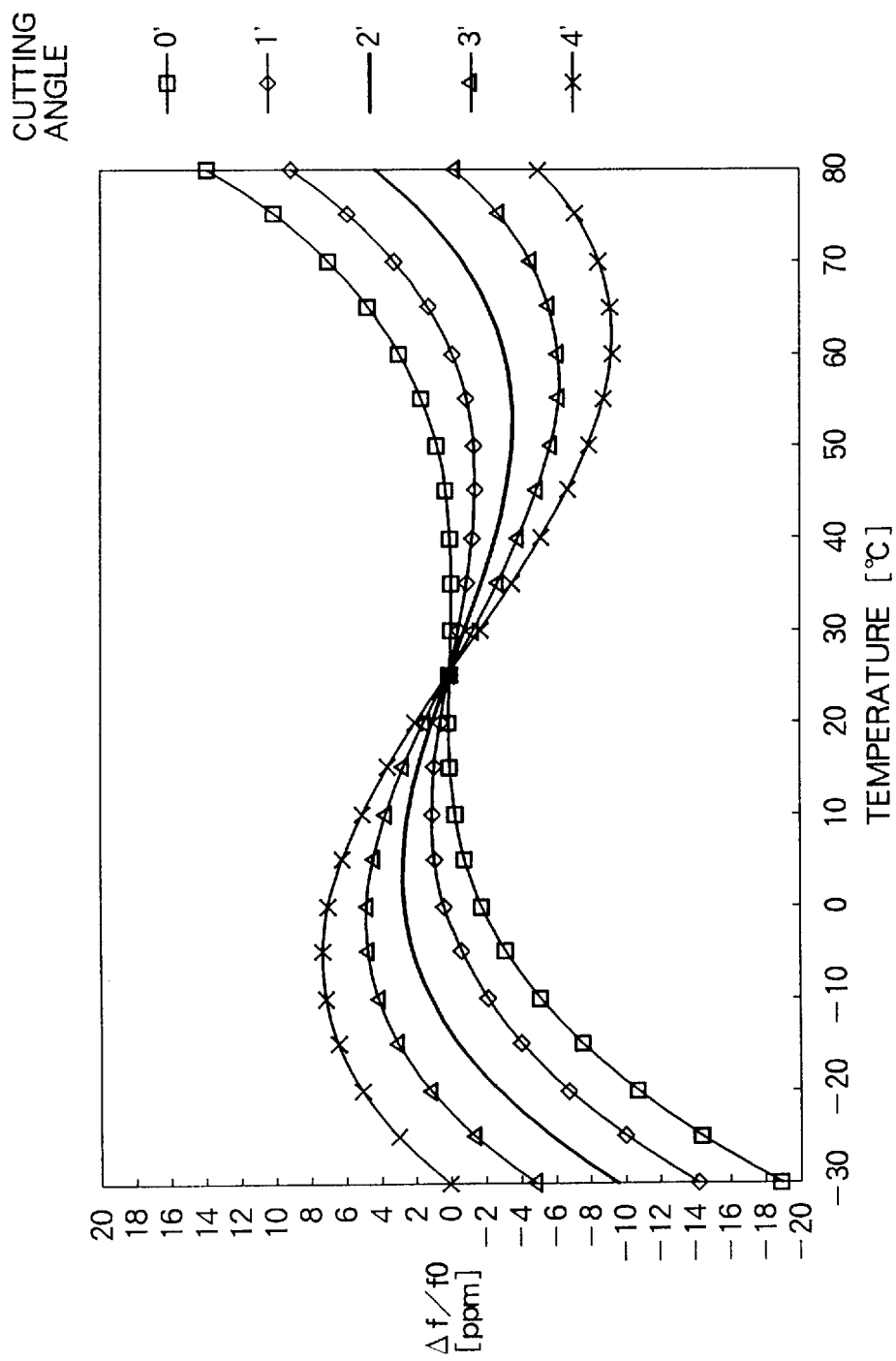
FIG. 6 is a view showing temperature-frequency variation characteristics of AT-cut quartz resonators of various cutting angles.

Depending upon cutting angles, AT-cut quartz resonators exhibit different temperature-frequency variation characteristics as illustrated in FIG. 6. For convenience of description, the illustrated temperature-frequency variation characteristics are ideal ones. Practically, however, the temperature-frequency variation characteristic of each of individual AT-cut quartz resonator is slightly different from that shown in FIG. 6 under the influence of a mounting condition of a resonator piece, such as a fixing method, a bonding material, and a heat treatment condition as well as the configuration of the resonator piece.

As will be understood from FIG. 6, each of the AT-cut quartz resonators vibrates with different natural resonant frequencies f as center frequencies in correspondence to different temperatures. In particular, the AT-cut quartz resonator has a predetermined natural resonant frequency $f_0$ at a predetermined temperature (herein, about 25° C.). A deviation between the natural resonant frequency f and the predetermined natural resonant frequency f0 is represented by Δf(=f−f0). A frequency deviation ratio is defined a ratio Δf/f0 of the deviation Δf to the predetermined natural resonant frequency f0. The AT-cut quartz resonator has a temperature-frequency variation characteristic such that the frequency deviation ratio ($\Delta f/f_0$) varies in response to the temperature variation along a cubic curve having a positive cubic coefficient with an inflection point at the predetermined temperature. For convenience of description, such cubic cube will hereafter briefly be referred to as a positive-coefficient cubic curve.

As will be understood from FIG. 6, the frequency-temperature characteristic of the AT-cut quartz resonator is different depending upon the cutting angle of a principal surface of the quartz resonator.

Figure 7:
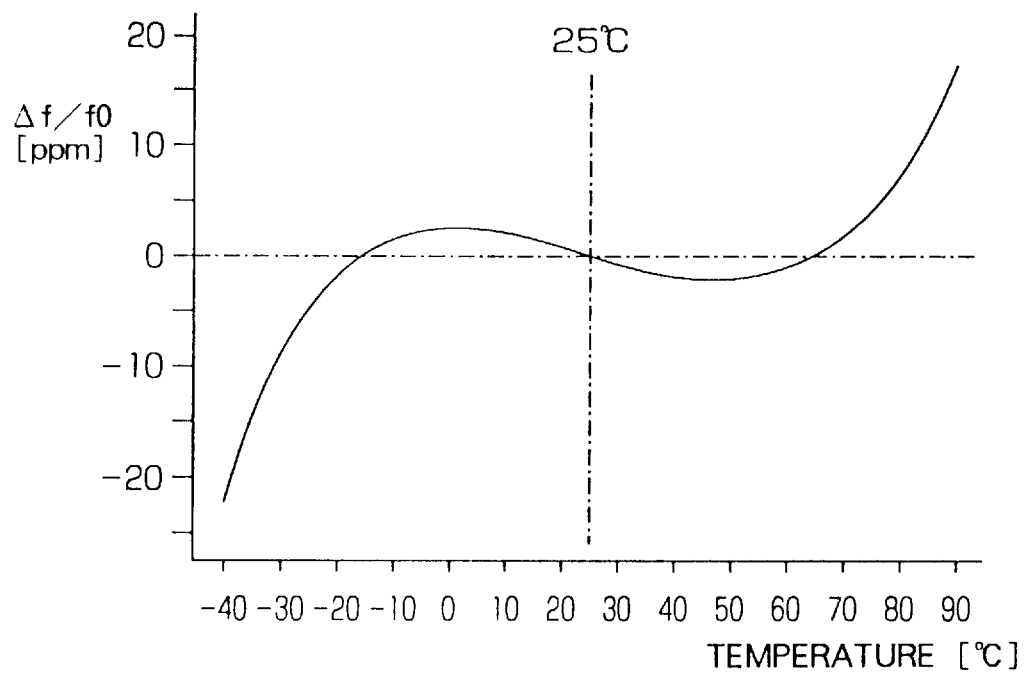
FIG. 7 shows a temperature-frequency characteristic of a +2' AT-cut quartz resonator among those illustrated in FIG. 6 for describing the principle of this invention.

Referring to FIG. 7, description will be made about the case where the AT-cut quartz resonator has a principal surface with a cutting angle of +2' by way of example. The +2' AT-cut quartz resonator has a temperature-frequency variation characteristic represented by a positive-coefficient cubic curve illustrated in FIG. 7.

Figure 8:
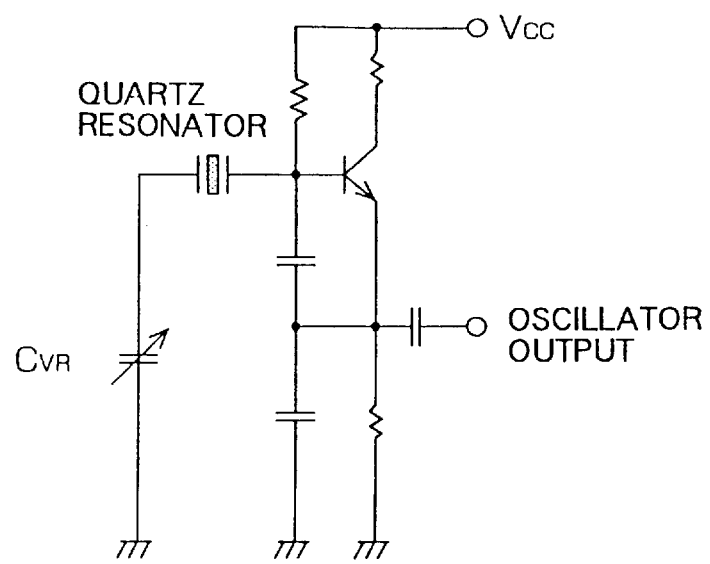
FIG. 8 shows a Colpitts oscillation circuit for describing the principle of this invention.

Referring to FIG. 8, a Colpitts oscillation circuit comprises a quartz resonator, a varicap having a variable capacitance $C_{VR}$, a transistor, resistors, and condensers and has an input port connected to a power supply $V_{CC}$ and an output port for an oscillator output.

Figure 9:
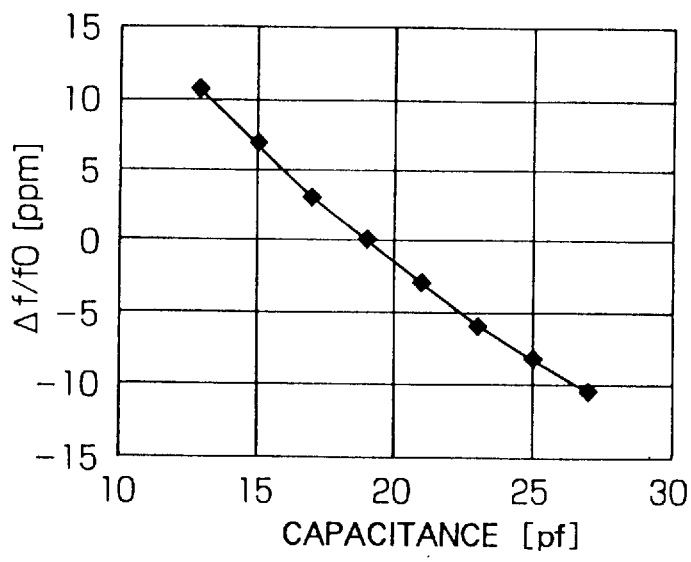
FIG. 9 shows a capacitance-frequency variation characteristic of the oscillation circuit in FIG. 8.

Referring to FIG. 9, the oscillation circuit has a frequency capacitance response as a relationship between a total capacitance of the oscillation circuit including the variable capacitance $C_{VR}$ and a frequency deviation ratio $\Delta f/f_0$ of the oscillation frequency with respect to a predetermined frequency. The frequency capacitance response will often be referred to as a capacitance-frequency variation characteristic.

The capacitance-frequency variation characteristic described above is inherent to each individual oscillation circuit and can be known upon designing the oscillation circuit.

Figure 10:
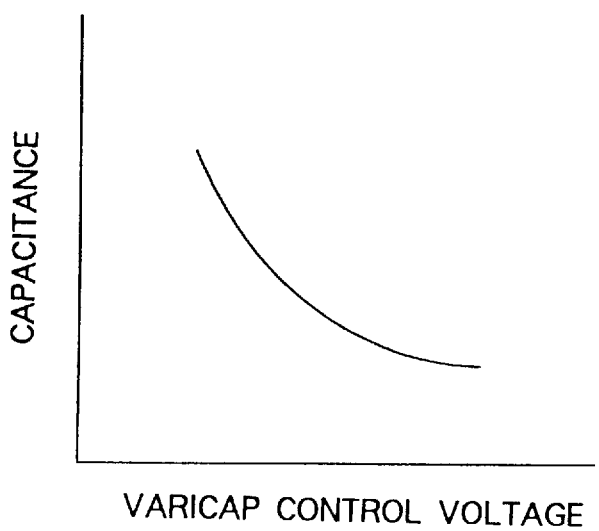
FIG. 10 shows a voltage-capacitance characteristic of a varicap illustrated in FIG. 8.

Referring to FIG. 10, the varicap has a capacitance voltage response or a voltage-capacitance characteristic as a relationship between a varicap control voltage and a variable capacitance of the varicap.

The voltage-capacitance characteristic of the varicap is inherent to each individual varicap and is known upon designing the oscillation circuit.

Turning back to FIG. 7, consideration will be made about the case where the temperature is 80° C. In this event, the frequency deviation ratio $\Delta f/f_0$ is about +6 ppm in accordance with the temperature-frequency variation characteristic of the quartz resonator as far as no temperature compensation is performed. Referring to FIG. 9, the frequency deviation ratio $\Delta f/f_0$ varies following the variation of the total capacitance of the oscillation circuit. Let the total capacitance be selected to be a value (about 23 pF) greater than that (about 19 pF) when the frequency deviation ratio $\Delta f/f_0$ is equal to zero (namely, when the oscillation frequency is equal to the predetermined frequency). In this event, the frequency deviation ratio $\Delta f/f_0$ is equal to about −6 ppm in accordance with the capacitance-frequency variation characteristic. Thus, the frequency deviation ratio of +6 ppm described above can be cancelled within the oscillation circuit, namely, the frequency deviation ratio of the oscillation circuit as a whole can be approximated to zero.

It will be understood that, the capacitance of the oscillation circuit can be adjusted to a desired value by changing the variable capacitance $C_{VR}$ of the varicap which is one of load capacitances of the oscillation circuit.

Referring to FIG. 10, in order to increase the variable capacitance $C_{VR}$ of the varicap, the varicap control voltage must have a level lower than that applied when the oscillation frequency is equal to the predetermined frequency.

Figure 11:
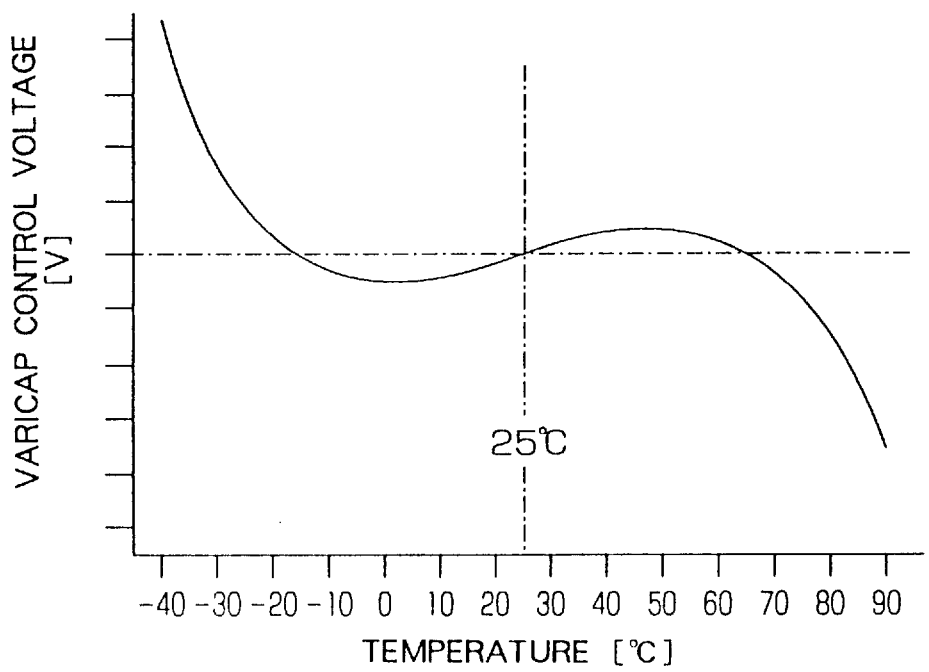
FIG. 11 shows the relationship between a varicap control voltage and an oscillating part temperature according to the principle of this invention.

Considering about each temperature point in FIG. 7 in the similar manner, it is concluded that, in order to cancel the temperature-frequency variation characteristic of the quartz resonator illustrated in FIG. 7, the varicap of the oscillation circuit (FIG. 8) must be controlled in accordance with a varicap control characteristic illustrated in FIG. 11. As illustrated in the figure, the varicap control voltage varies in response to the temperature variation along a cubic curve having a negative cubic coefficient. Such cubic curve will hereafter be referred to as a negative-coefficient cubic curve. By applying the varicap control voltage in accordance with the varicap control characteristic, the quartz oscillation circuit can be temperature compensated.

Figure 12:
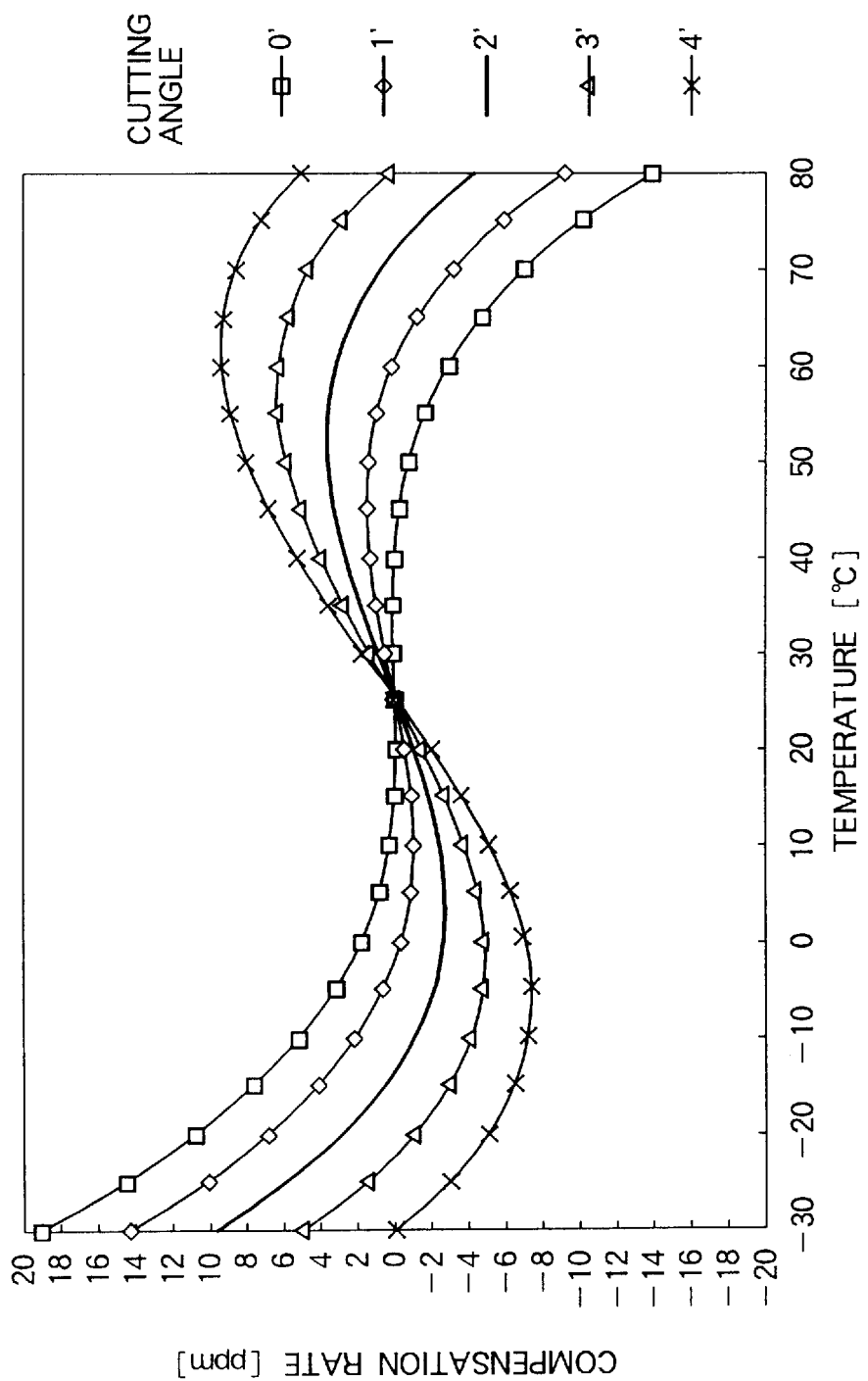
FIG. 12 shows compensation rates according to the principle of this invention for the various cutting angles in FIG. 6.

Referring to FIG. 12, temperature compensation is similarly carried out by the use of characteristic curves shown in the figure for those oscillation circuits which comprise the quartz resonators of the different cutting angles and which have the temperature-frequency variation characteristics in FIG. 6. In FIG. 12, the characteristic curves show the varicap control characteristics in terms of a compensation rate (ppm) as a frequency deviation of the oscillation circuit.

Based on the above-mentioned principle, the temperature-compensated quartz oscillator of this invention has a temperature characteristic compensating portion capable of producing the varicap control voltage $V_{VR}$ to be applied to the varicap. As will later be described, the temperature characteristic compensating portion carries out analog processing upon a detected voltage varying in response to the temperature variation to produce a resultant voltage varying along the negative-coefficient cubic curve in response to the temperature variation. The resultant voltage is subjected to further processing such as amplification to produce the varicap control voltage $V_{VR}$. Thus, in the temperature-compensated quartz oscillator of this invention, the varicap control voltage $V_{VR}$ produced in the temperature characteristic compensating portion is applied to the varicap to change the variable capacitance of the varicap. Thus, the oscillation frequency of the oscillation circuit is controlled to a desired basic frequency.

Now, description will be made about preferred embodiments of this invention with reference to FIGS. 13 through 36 together with FIGS. 6 through 12.

Figure 13:
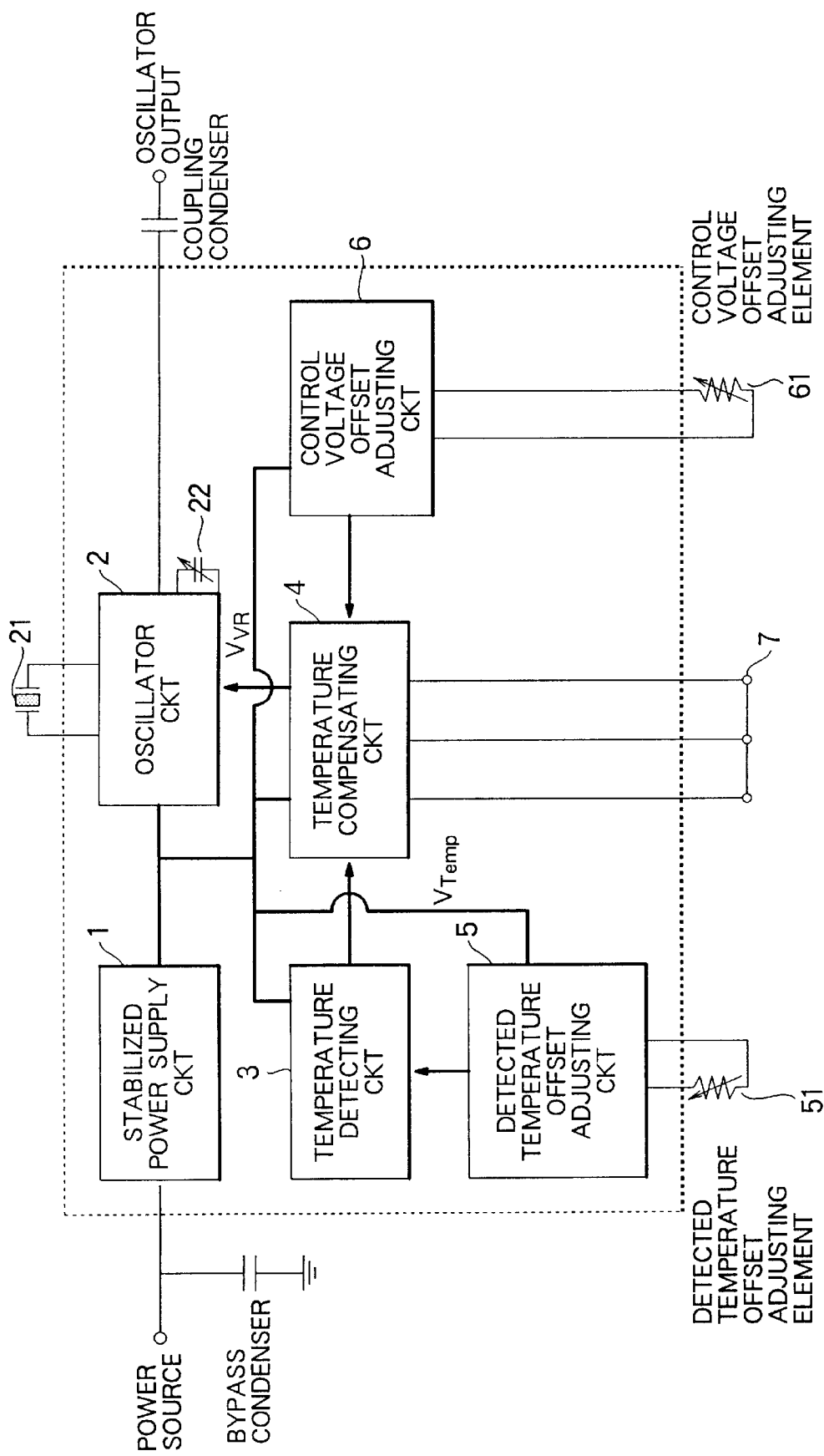
FIG. 13 is a block diagram of a temperature-compensated quartz oscillator according to this invention.

At first referring to FIG. 13, a temperature-compensated quartz oscillator according to an embodiment of this invention comprises a stabilized power supply circuit 1 for supplying a constant voltage, an oscillator circuit or oscillation circuit 2 including a quartz resonator 21 and a varicap 22, a temperature detecting circuit 3, and a temperature characteristic compensating portion 4 connected to the oscillation circuit 2 and the temperature detecting circuit 3.

The oscillation circuit 2 is designed with a known capacitance-frequency variation characteristic. The quartz resonator 21 has a known temperature-frequency variation characteristic. The varicap 22 has a known capacitance-voltage characteristic. In the following those characteristics will be described in detail.

Specifically, the capacitance-frequency variation characteristic of the oscillation circuit 2 is depicted at the inverse-proportional curve in FIG. 9. In the figure, an abscissa and an ordinate represent the capacitance of the oscillation circuit 2 and the frequency deviation ratio of the oscillation frequency with respect to the predetermined frequency, respectively.

The temperature-frequency variation characteristic of the quartz resonator 21 is depicted by the positive-coefficient cubic curve in FIG. 6 or 7. In the figure, an abscissa and an ordinate represent the temperature and the frequency deviation ratio $\Delta f/f_0$ of the natural resonant frequency, respectively. The characteristic curve has an inflection point at the predetermined natural resonant frequency $f_0$ at the predetermined temperature.

The voltage-capacitance characteristic of the varicap 22 is depicted by the inverse-proportional curve in FIG. 10. In the figure, an abscissa and an ordinate represent the varicap control voltage $V_{VR}$ and the capacitance, respectively.

The oscillation circuit 2 comprising the above-mentioned components oscillates at the predetermined frequency when the oscillating part temperature is equal to the predetermined temperature.

The temperature detecting circuit 3 comprises a temperature detecting element located in the vicinity of the oscillation circuit 2. The temperature detecting element has a known temperature-voltage characteristic. Therefore, by the use of the temperature-voltage characteristic of the temperature detecting element, the temperature detecting circuit 3 detects, as the detected voltage, a voltage corresponding to the oscillator part temperature and produces a detected voltage signal $V_{Temp}$ representative of the detected voltage. In particular, in this embodiment, the detected voltage signal $V_{Temp}$ represents a predetermined detected voltage $V_{NTemp}$ when the oscillating part temperature is the predetermined temperature. In response to the variation of the oscillating part temperature, the detected voltage signal $V_{Temp}$ varies along a straight line having a negative linear coefficient. It is noted here that the oscillating part temperature is the temperature of the vicinity of the oscillation circuit 2. As will readily be understood from the foregoing, the predetermined detected voltage $V_{NTemp}$ is a voltage detected when the oscillating part temperature is the predetermined temperature.

In order to adjust the oscillation frequency of the oscillation circuit 2 to the predetermined frequency as a desired frequency, the temperature characteristic compensating portion 4 produces through analog processing the varicap control voltage signal $V_{VR}$ representative of the varicap control voltage varying in response to the detected voltage signal $V_{Temp}$ produced from the temperature detecting circuit 3.

More specifically, the temperature characteristic compensating portion 4 comprises a converted voltage signal producing unit, a basic voltage signal producing unit, a set voltage signal producing unit, and a varicap control signal producing unit.

The converted voltage signal producing unit is supplied with the detected voltage signal $V_{Temp}$ and produces a converted voltage signal $V_{LOAD}$ representative of a converted voltage. The converted voltage of the converted voltage signal $V_{LOAD}$ varies in response to the detected voltage signal $V_{Temp}$ in the following manner. Specifically, when the detected voltage signal $V_{Temp}$ represents the predetermined detected voltage $V_{NTemp}$ (namely, when the oscillating part temperature is the predetermined temperature), the converted voltage is a zero voltage. In response to the variation of the detected voltage signal $V_{Temp}$ (namely, in response to the variation of the oscillating part temperature), the converted voltage varies along a positive-coefficient no-peak cubic curve having an inflection point when the converted voltage is equal to the zero voltage.

The basic voltage signal producing unit produces a basic voltage signal $V_{offset}$ representative of a basic voltage which is a predetermined voltage corresponding to a predetermined varicap control voltage (which will later be described) represented by the varicap control voltage signal $V_{VR}$ when the oscillating part temperature is the predetermined temperature.

The set voltage signal producing unit produces a set voltage point representative of a set voltage having a voltage level equal to the predetermined detected voltage $V_{NTemp}$.

The varicap control voltage signal producing unit produces the varicap control voltage signal $V_{VR}$ by the use of the converted voltage signal $V_{LOAD}$, the basic voltage signal $V_{offset}$, and the set voltage signal. Herein, the varicap control voltage signal $V_{VR}$ represents the varicap control voltage which varies in response to the temperature variation. Specifically, the varicap control voltage signal $V_{VR}$ represents the predetermined varicap control voltage when the oscillating part temperature is the predetermined temperature. In response to the variation of the oscillation part temperature, the varicap control voltage represented by the varicap control voltage signal $V_{VR}$ varies along the negative-coefficient cubic curve with the inflection point at the predetermined varicap control voltage. As described above, the predetermined varicap control voltage is equal in voltage level to the basic voltage signal $V_{offset}$.

Based on the principle described above, the temperature-compensated quartz oscillator of the above-mentioned structure detects as the detected voltage the oscillating part temperature. The detected voltage signal $V_{Temp}$ representative of the detected voltage is subjected to analog processing to produce the varicap control voltage signal $V_{VR}$ representative of the varicap control voltage in correspondence to the oscillating part temperature. The varicap control voltage signal $V_{VR}$ is supplied to the varicap 22. Thus, temperature compensation is performed.

Next, an operation of each of the temperature detecting circuit 3 and the temperature characteristic compensating portion 4 will be described more in detail.

Figure 14:
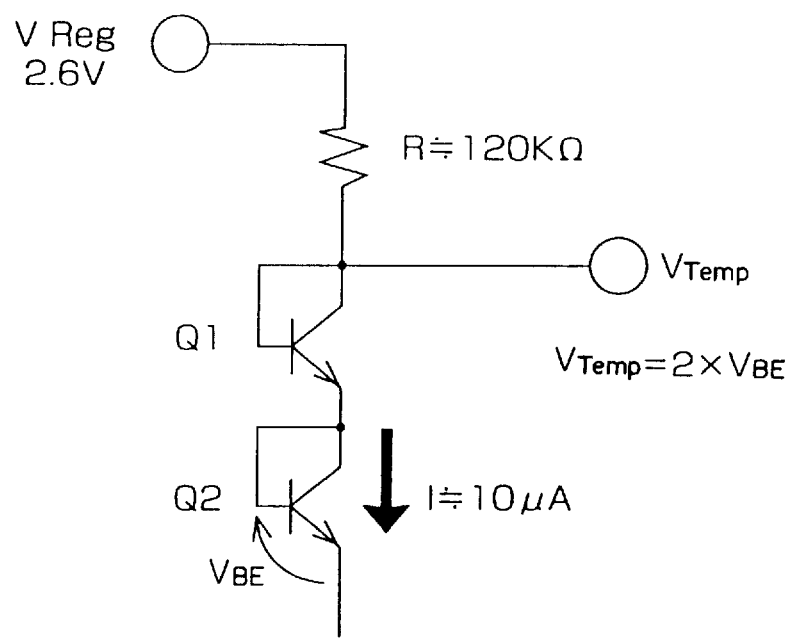
FIG. 14 shows a temperature detecting circuit illustrated in FIG. 13.

Referring to FIG. 14, the temperature detecting circuit 3 in this embodiment comprises first and second diode-connected transistors Q1 and Q2, and a resistor R.

Generally, a forward voltage $V_{BE}$ between an emitter and a base of a transistor is represented by a straight line having a negative linear coefficient with respect to an increase in temperature. As well known, the temperature-dependent variation characteristic of the forward voltage $V_{BE}$ is excellent in stability against aging and reproducibility. Accordingly, use is made of the diode-connected transistor as the temperature detecting element.

As compared with the use of a single diode-connected transistor, the temperature detecting circuit comprising a plurality of diode-connected transistors achieves a greater variation in detected voltage in correspondence to the temperature. Generally, the accuracy in temperature detection is higher when the variation in voltage level (detected voltage) of the detected voltage signal $V_{temp}$ in response to the temperature variation is greater. On the other hand, the variation in voltage level is restricted by a source voltage. Therefore, in this embodiment, use is made of two transistors supposing that the source voltage is about 3V.

Figure 15:
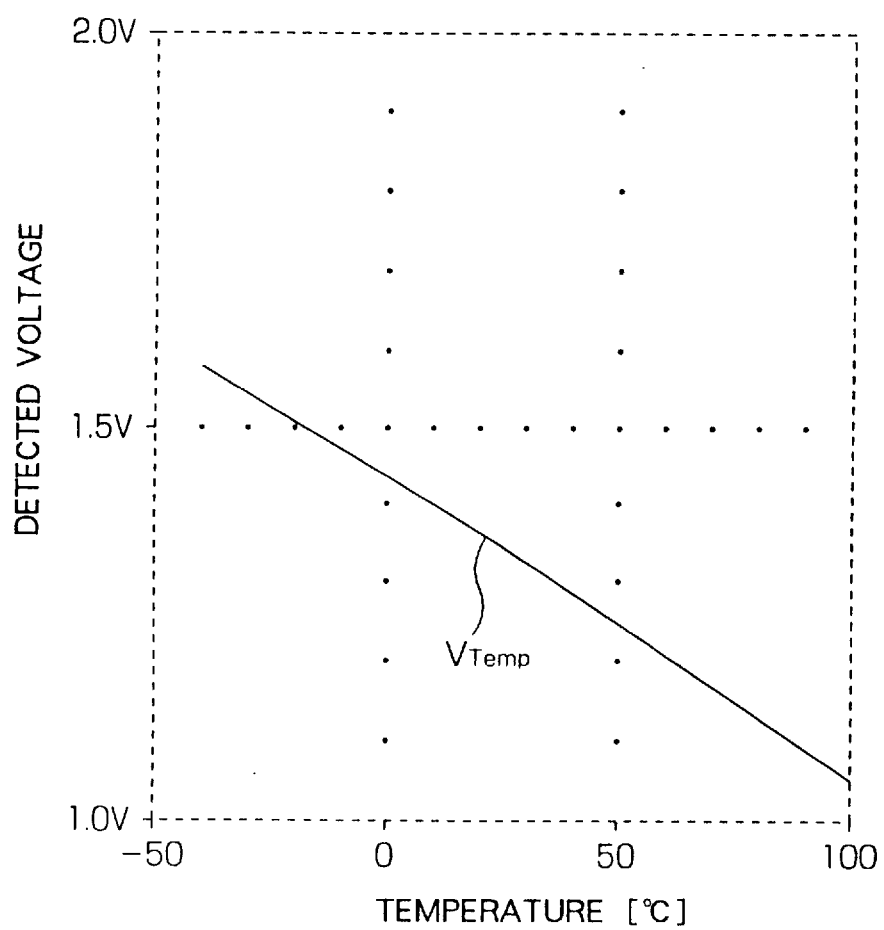
FIG. 15 shows the relationship between a detected voltage detected by the temperature detecting circuit in FIG. 14 and the oscillating part temperature.

The detected voltage signal $V_{Temp}$ produced by the temperature detecting circuit 3 of the above-mentioned structure varies in response to the temperature variation along a straight line having a negative linear coefficient, as illustrated in FIG. 15.

The negative linear coefficient as a gradient of the straight line illustrated in FIG. 15 is determined by the temperature detecting element (the two transistors in this embodiment). On the other hand, an intercept of the straight line in FIG. 15 can be adjusted by the resistor incorporated in the temperature detecting circuit 3.

In other words, the variation in voltage level of the detected voltage signal $V_{Temp}$ with respect to the oscillating part temperature is determined as the gradient of the straight line by the temperature detecting element. The voltage level of the detected voltage signal $V_{Temp}$ corresponding to each oscillating part temperature can be adjusted as the intercept of the straight line by the resistor incorporated in the temperature detecting circuit 3.

As described above, the negative linear coefficient representing the characteristic of the detected voltage signal $V_{Temp}$ is determined by the temperature detecting element. If desired, the linear coefficient can be changed, for example, by amplifying the detected voltage signal $V_{Temp}$.

Now, description will be made in detail in regards the temperature characteristic compensating portion or circuit 4.

As described above, the temperature characteristic compensating portion 4 comprises the converted voltage signal producing unit, the basic voltage signal producing unit, the set voltage signal producing unit, and the varicap control voltage signal producing unit.

Particularly, description will hereinafter be made about the structure and the operation of the converted voltage signal producing unit.

Figure 16:
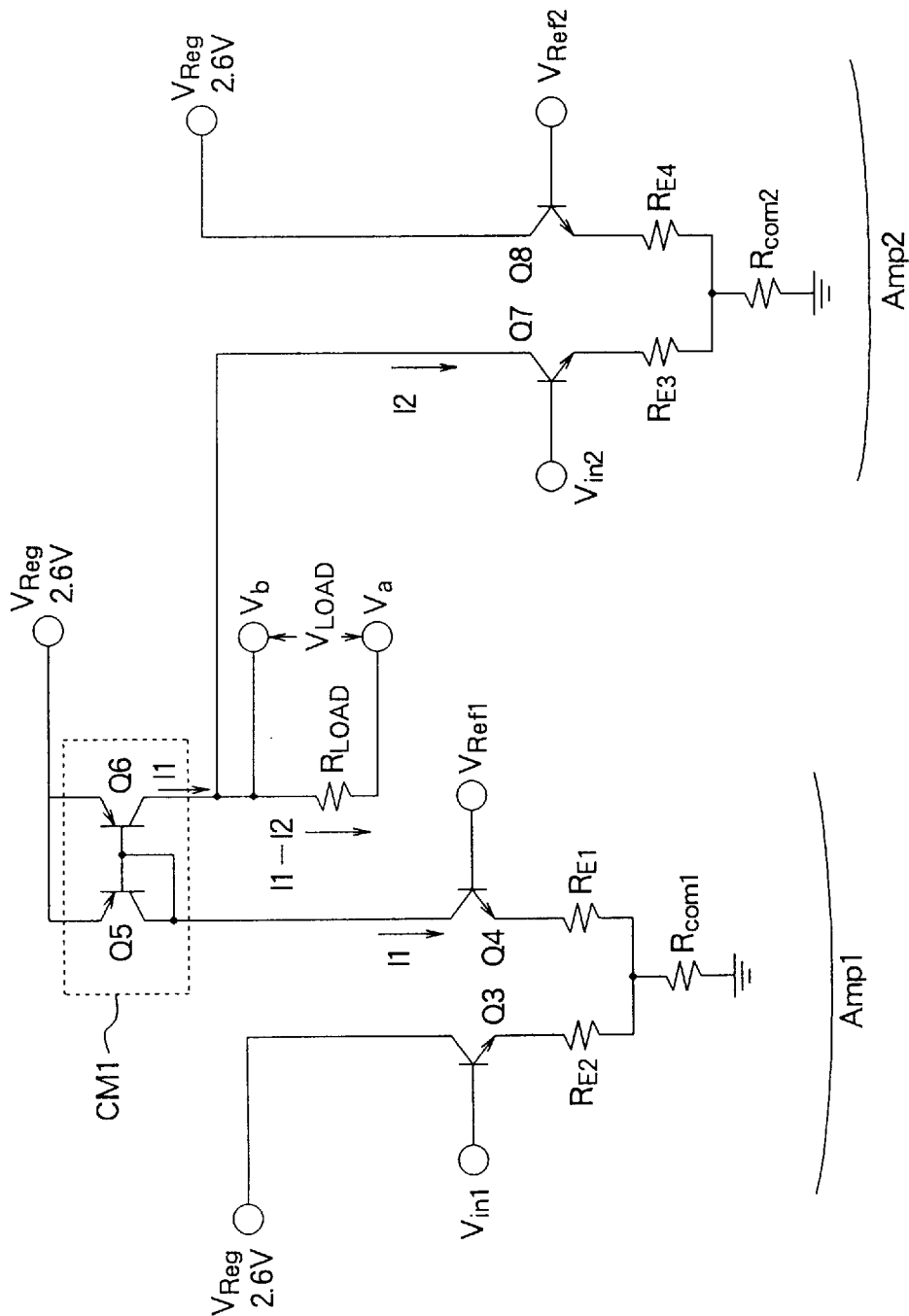
FIG. 16 shows first and second differential amplifiers in a temperature characteristic compensating portion illustrated in FIG. 13.

Referring to FIG. 16, the converted voltage signal producing unit comprises first and second differential amplifiers Amp1 and Amp2, a first current mirror circuit CM1, and a resistor $R_{LOAD}$.

Figure 17:
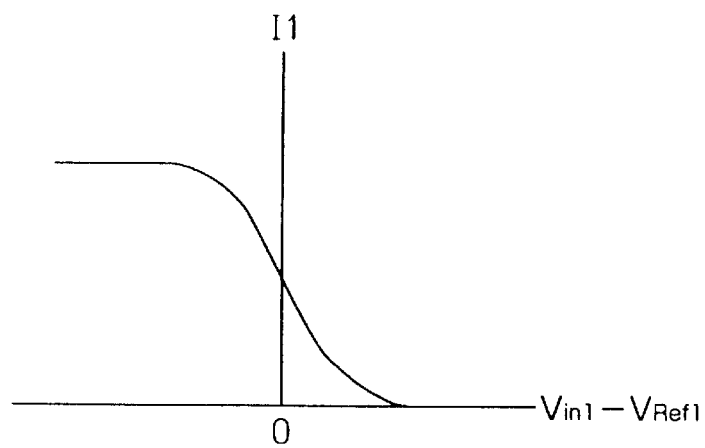
FIG. 17 shows a first collector current of the first different amplifier illustrated in FIG. 16.

The first differential amplifier Amp1 illustrated in the figure has a pair of transistors Q3 and Q4. The first differential amplifier Amp1 is supplied with a first input voltage signal $V_{in1}$ and a first reference voltage signal $V_{Ref1}$ as inputs to bases of the transistors Q3 and Q4, respectively. The first reference voltage signal $V_{Ref1}$ represents a first reference voltage lower than the predetermined detected voltage $V_{NTemp}$. It is assumed here that the two transistors Q3 and Q4 have the same characteristic and the same temperature in the first differential amplifier Amp1. In this event, a collector current $I_1$ of the transistor Q4 is given by:

$$I1 = \frac{\alpha I_{com1}}{1 + \exp\left[\frac{q}{kT}(V_{in1} - V_{Ref1})\right]}, \quad (1)$$

where $\alpha$ represents a grounded base current amplification factor, $I_{com1}$, an electric current flowing through a resistor $R_{com1}$, T, the absolute temperature, q, a unit charge, k, a Boltzmann constant. Thus, the collector current $I_1$ varies in response to the variation in voltage level of the first input voltage signal $V_{in1}$, as illustrated in FIG. 17.

Figure 18:
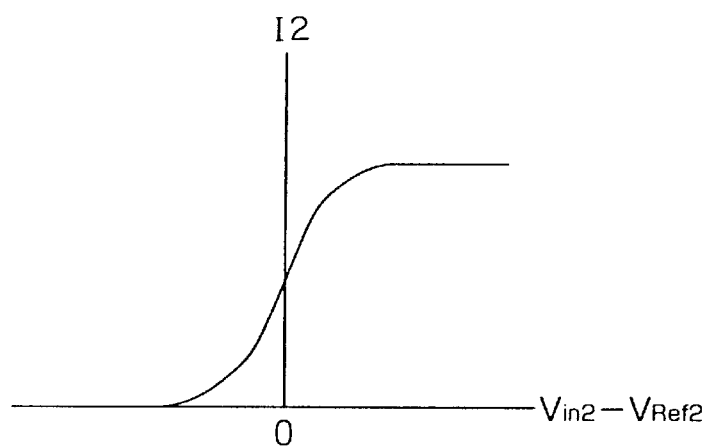
FIG. 18 shows a second collector current of the second differential amplifier illustrated in FIG. 16.

Likewise, the second differential amplifier Amp2 has a pair of transistors Q7 and Q8. The second differential amplifier Amp2 is supplied with a second input voltage signal $V_{in2}$ and a second reference voltage signal $V_{Ref2}$ as inputs to bases of the transistors Q7 and Q8, respectively. The second reference voltage signal $V_{Ref2}$ represents a second reference voltage higher than the predetermined detected voltage $V_{NTemp}$. In the manner similar to the first differential amplifier Amp1, it is assumed that the transistors Q7 and Q8 have the same characteristic and the same temperature in the second differential amplifier Amp2. In this event, a collector current $I_2$ of the transistor Q7 is given by:

$$I2 = \frac{\alpha I_{com2}}{1 + \exp\left[\frac{q}{kT}(V_{in2} - V_{Ref2})\right]}, \quad (2)$$

where $I_{com2}$ represents an electric current flowing through a resistor $R_{com2}$. Thus, the collector current $I_2$ varies in response to the variation in voltage level of the second input voltage signal $V_{in2}$, as illustrated in FIG. 18.

In the first and the second differential amplifiers Amp1 and Amp2, resistors $RE_1$, $RE_2$, $RE_3$, and $RE_4$ are inserted at the side of emitters of the transistors Q4, Q3, Q7, and Q8, respectively. If resistance of the resistors $RE_1$, $RE_2$, $RE_3$, and $RE_4$ are reduced, the gradient of each curve in FIGS. 17 and 18 is reduced. If the resistance values of the resistors $R_{com1}$ and $R_{com2}$ are reduced, a maximum current (namely, a collector saturation current) is increased for each of the collector currents I1 and I2 of the transistors Q4 and Q7, respectively. Although $R_{E1}=R_{32}$ and $R_{E3}=R_{E4}$ in a typical design, the operation is basically similar if $R_{E1} \neq R_{E2}$ and $R_{E3} \neq R_{E4}$.

The collector current I1 of the first differential amplifier Amp1 flows to the resistor $R_{LOAD}$ in FIG. 16 through the first current mirror circuit CM1 while the collector current I2 of the second differential amplifier Amp2 directly flows the resistor $R_{LOAD}$. This means that the first current mirror circuit CM1 in FIG. 16 and a connection point of the first current mirror circuit CM1 and the transistor Q7 forms a current combining and arrangement for combining the collector currents I1 and I2 in the manner such that the collector current I2 is subtracted from the collector current I1. The current combining arrangement is not restricted to the above-mentioned structure but may have a different structure, for example, with a resistor as far as the similar operation can be carried out. The current mirror circuit CM1 in FIG. 17 comprises two transistors Q5 and Q6. Alternatively, three or more transistors may be included. In this event, a conversion ratio of the current to be transmitted can be changed by selecting the ratio of the numbers of the transistors.

In this embodiment, the direction of the current flowing to the resistor $R_{LOAD}$ is specified as follows. That is, the collector current I1 flowing to the resistor $R_{LOAD}$ through the first current mirror circuit CM1 has a positive direction. In this event, the current flowing to the resistor $R_{LOAD}$ in correspondence to the collector current I2 is expressed as −I2. As a result, a combined current I=I1+(−I2)=I1−I2 flows to the resistor $R_{LOAD}$.

It is assumed here that each of the first and the second input voltage signals $V_{in1}$ and $V_{in2}$ is the above-mentioned detected voltage signal $V_{Temp}$ and that the detected voltage signal $V_{Temp}$ represents the predetermined detected voltage $V_{NTemp}$. The first and the second reference voltage signals $V_{Ref1}$ and $V_{Ref2}$ are given voltage levels such that a difference obtained by subtracting the collector current I2 of the second differential amplifier from the collector current I1 of the first differential amplifier is equal to zero. In this even, the combined current I (=I1−I2) flowing to the resistor $R_{LOAD}$ in FIG. 16 is as follows.

Figure 19:
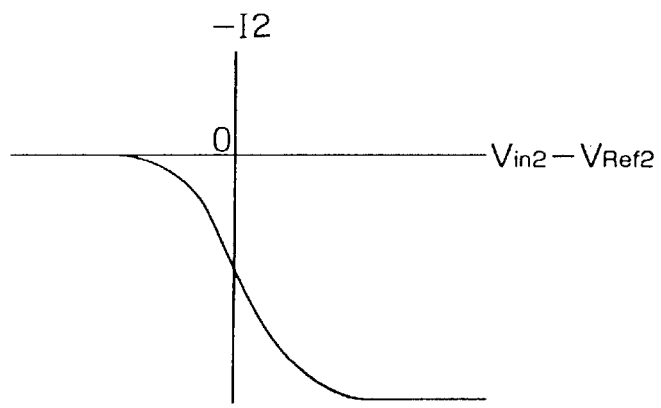
FIG. 19 shows an inverted current of the second collector current in FIG. 18.
Figure 20:
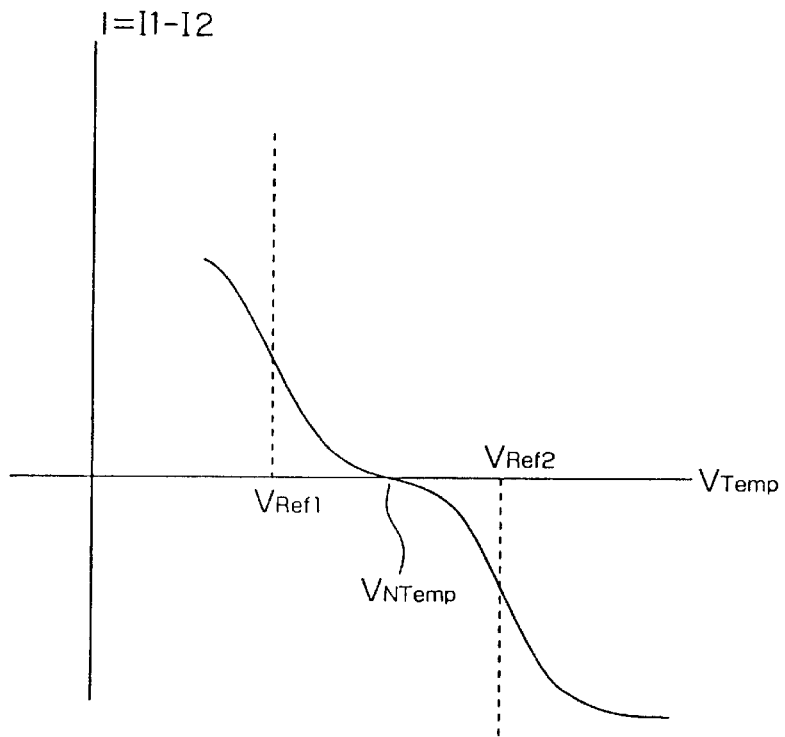
FIG. 20 shows a combined current as a combination of the first and the second collector currents in FIGS. 17 and 19.

Specifically, as is obvious from FIGS. 17 through 19, the first and the second reference voltage signals $V_{Ref1}$ and $V_{Ref2}$ are selected to have the following relationship:

$$V_{Ref1} < V_{NTemp} < V_{Ref2}.$$

The combined current I (=I1−I2) is equal to zero when the detected voltage signal $V_{Temp}$ is equal to the predetermined detected voltage $V_{NTemp}$. Therefore, the combined current I (=I1−I2) flowing to the resistor $R_{LOAD}$ varies along a curve shown in FIG. 20 in response to the variation in voltage level of the detected voltage signal $V_{Temp}$ Referring to FIG. 20, an abscissa represents the detected voltage signal $V_{Temp}$. Taking the relationship between the detected voltage signal $V_{Temp}$ and the oscillating part temperature in FIG. 15 into consideration, the characteristic of the combined current I (=I1−I2) flowing to the resistor $R_{LOAD}$ is transformed into that illustrated in FIG. 21 with an abscissa representing the oscillating part temperature. Specifically, the combined current I (=I1−I2) flowing to the resistor $R_{LOAD}$ has a current value of zero when the oscillating part temperature is the predetermined temperature. In response to the variation of the oscillating part temperature, the combined current I varies along a positive-coefficient no-peak cubic curve having an inflection point when the current value is equal to zero.

Figure 22:
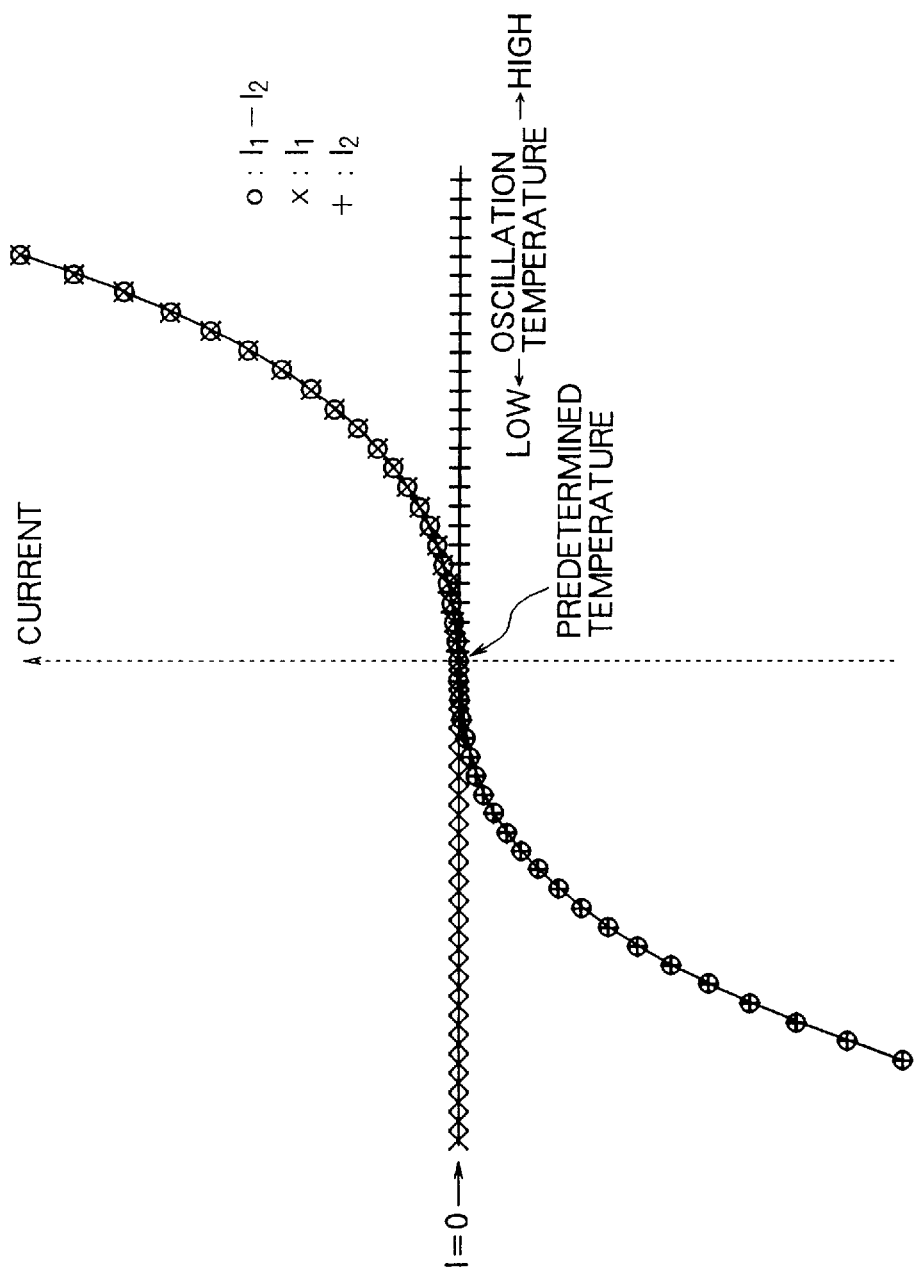
FIG. 22 shows the combined current in case where first and second reference voltages are selected so that operation temperature ranges of the first and the second differential amplifiers do not overlap each other.
Figure 23:
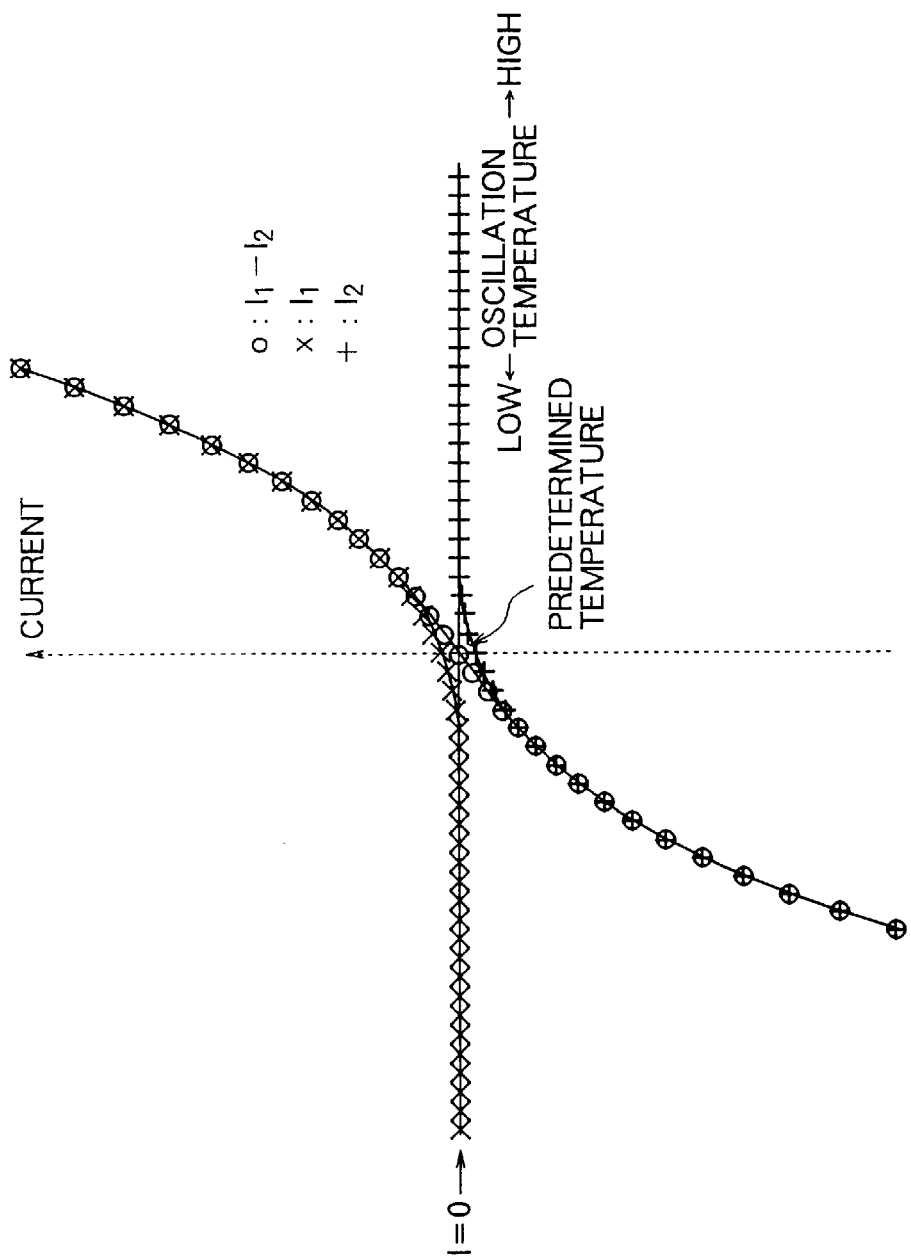
FIG. 23 shows the combined current in case where the first and second reference voltages are selected so that the operation temperature ranges of the first and the second differential amplifiers overlap each other.
Figure 24:
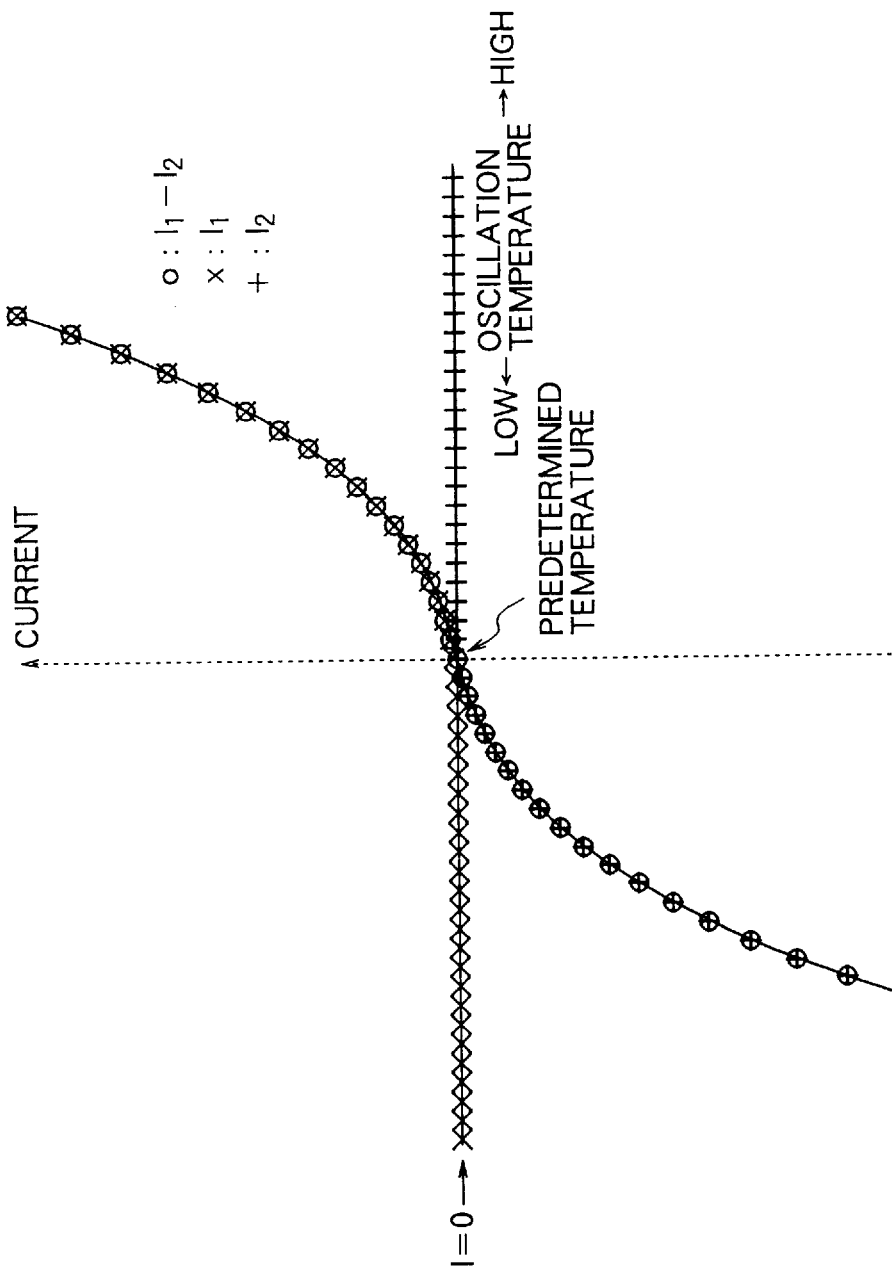
FIG. 24 shows the combined current in case where the first and the second reference voltages are selected so that operation start temperatures of the first and the second differential amplifiers are equal to each other.

Referring to FIGS. 22 through 24, the above-mentioned conditions are satisfied by the first and the second reference voltage signals $V_{Ref1}$ and $V_{Ref2}$ exemplified in the figures. In each of these figures, an abscissa represents the oscillating part temperature. The collector current I1 of the first differential amplifier Amp1 is depicted by ×. The inverted current −I2 of the collector current I2 of the second differential amplifier Amp2 is represented by +. The combined current I (=I1−I2) flowing to the resistor $R_{LOAD}$ is depicted by ○.

Referring to FIG. 22, the combined current I ('I1−I2) flows to the resistor $R_{LOAD}$ when operation temperature ranges (in which the collector current as an output current rises) of the first and the second differential amplifiers Amp1 and Amp2 do not overlap each other. Referring to FIG. 23, the combined current I (=I1−I2) flows to the resistor $R_{LOAD}$ when the operation temperature ranges of the first and the second differential amplifiers Amp1 and Amp2 overlap each other. Referring to FIG. 24, the combined current I (=I1−I2) flows to the resistor $R_{LOAD}$ when operation start temperatures (at which the collector current as an output rises) of the first and the second differential amplifiers Amp1 and Amp2 are equal to each other.

In any one of FIGS. 21 to 24, an ordinate represents the combined current I (=I1−I2) flowing to the resistor $R_{LOAD}$. By multiplying the combined current I by the resistance value of the resistor $R_{LOAD}$ in FIG. 16, the converted voltage of a converted voltage signal $V_{LOAD}$ in FIG. 16 is obtained. Specifically, the characteristic curves are similar to those illustrated in FIGS. 21 through 24 if the abscissa and the ordinate represent the oscillating part temperature and the converted voltage signal $V_{LOAD}$, respectively.

In this embodiment, by the use of rising characteristics of the first and the second differential amplifiers Amp1 and Amp2, the current (or the converted voltage) is obtained which varies along the positive-coefficient no-peak cubic curve in response to the variation of the oscillating part temperature.

Generally, in a differential amplifier, a collector current as an output is saturated to have a constant level when two input voltages have a voltage different greater than a particular level. In this embodiment, the voltage difference between the two input voltages supplied to the differential amplifiers corresponds to the temperature difference between the temperature indicated by the reference voltage and the oscillating part temperature.

Accordingly, the range of the voltage difference such that the collector current is not saturated corresponds to a compensatable temperature range.

In order to widen the compensatable temperature range, the first differential amplifier Amp1 comprises two differential amplifiers Amp1a and Amp1b while the second differential amplifier Amp2 comprises two differential amplifiers Amp2a and Amp2b.

In this case, the reference voltages supplied to the two differential amplifiers Amp1a and Amp1b are selected so that detected voltage ranges capable of utilizing the rising characteristics of the differential amplifiers Amp1a and Amp1b are continuous. Then, the collector currents of the two differential amplifiers Amp1a and Amp1b are combined. With this structure, the first differential amplifier Amp1 apparently has a wide detected voltage range capable of utilizing the rising characteristic. This also applies to the second differential amplifier Amp2.

The converted voltage signal producing unit comprising the first and the second differential amplifiers described above can increase the compensatable temperature range.

It will readily be understood that each of the first and the second differential amplifiers Amp1 and Amp2 comprises three or more differential amplifiers based on the similar concept. Such structure will be selected taking into account that a circuit area inevitably becomes large although the compensatable temperature range is widened.

Turning back to FIG. 16, it is assumed that a terminal Vb is supplied with the basic voltage signal $V_{offset}$. In this event, an output voltage signal produced from an output terminal Va varies along a curve illustrated in FIG. 25 in response to the variation of the oscillating part temperature. Specifically, the output voltage signal at the terminal Va is a combination of the basic voltage signal $V_{offset}$ and the converted voltage signal $V_{LOAD}$ in the manner such that the basic voltage of the basic voltage signal $V_{offset}$ is subtracted from the converted voltage of the converted voltage signal $V_{LOAD}$ corresponding to the oscillating part temperature.

Figure 25:
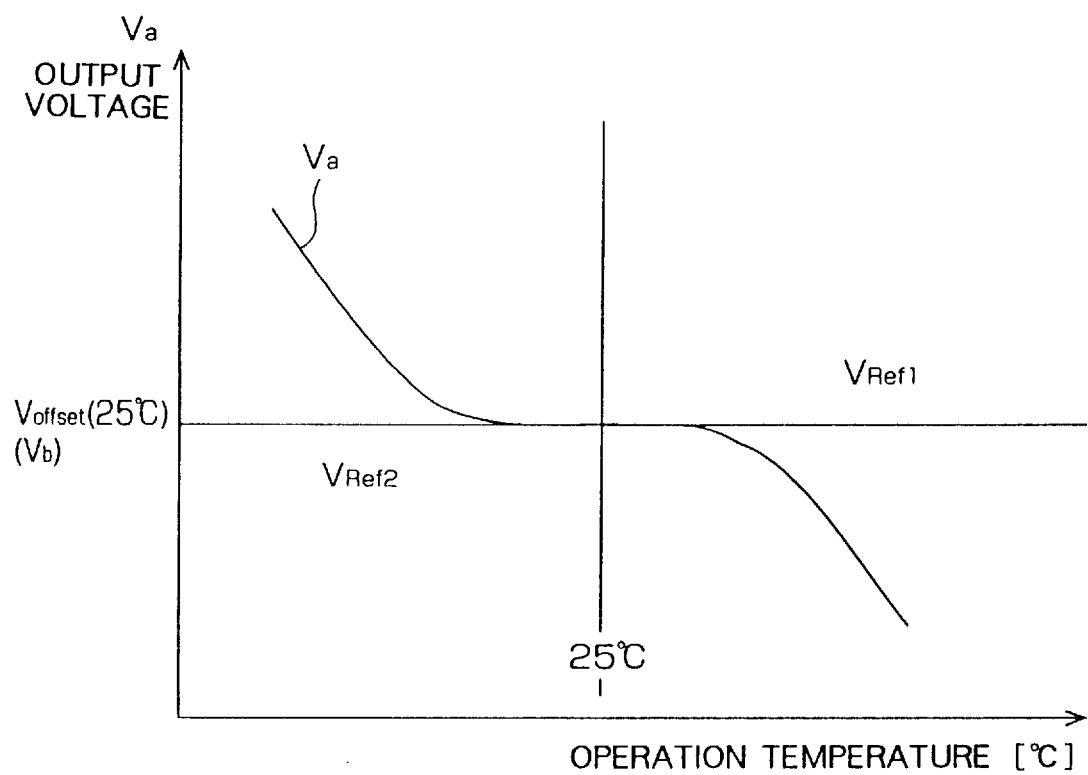
FIG. 25 shows the variation of an output voltage signal at a terminal Va in FIG. 16 when a basic voltage signal $V_{offset}$ is supplied to a terminal Vb.
Figure 26:
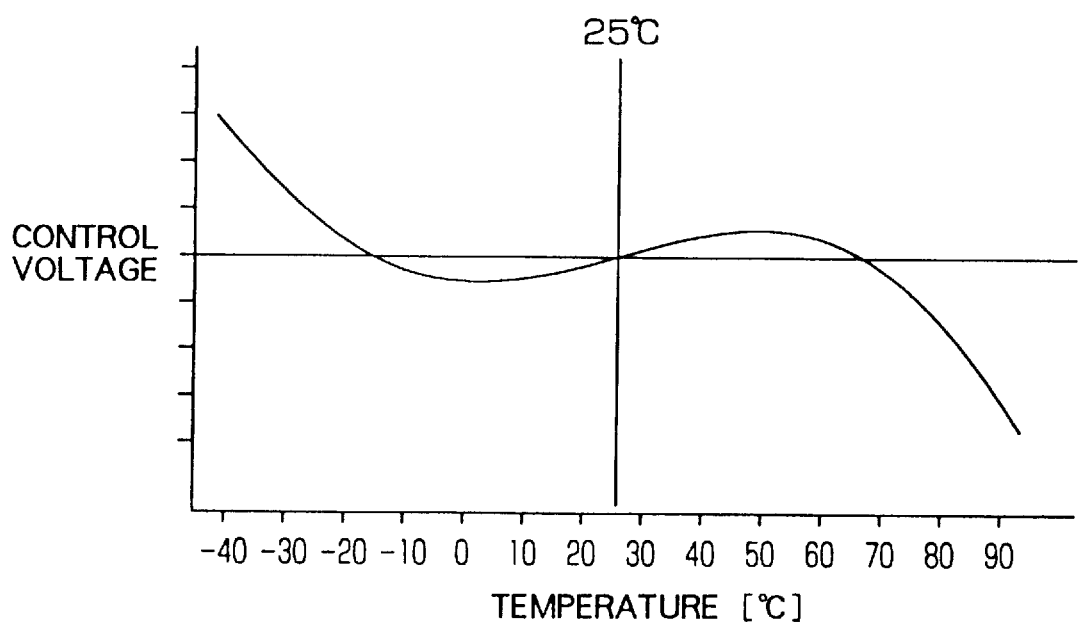
FIG. 26 shows a voltage signal obtained by subtracting a voltage difference signal from the output voltage signal in FIG. 25.
Figure 27:
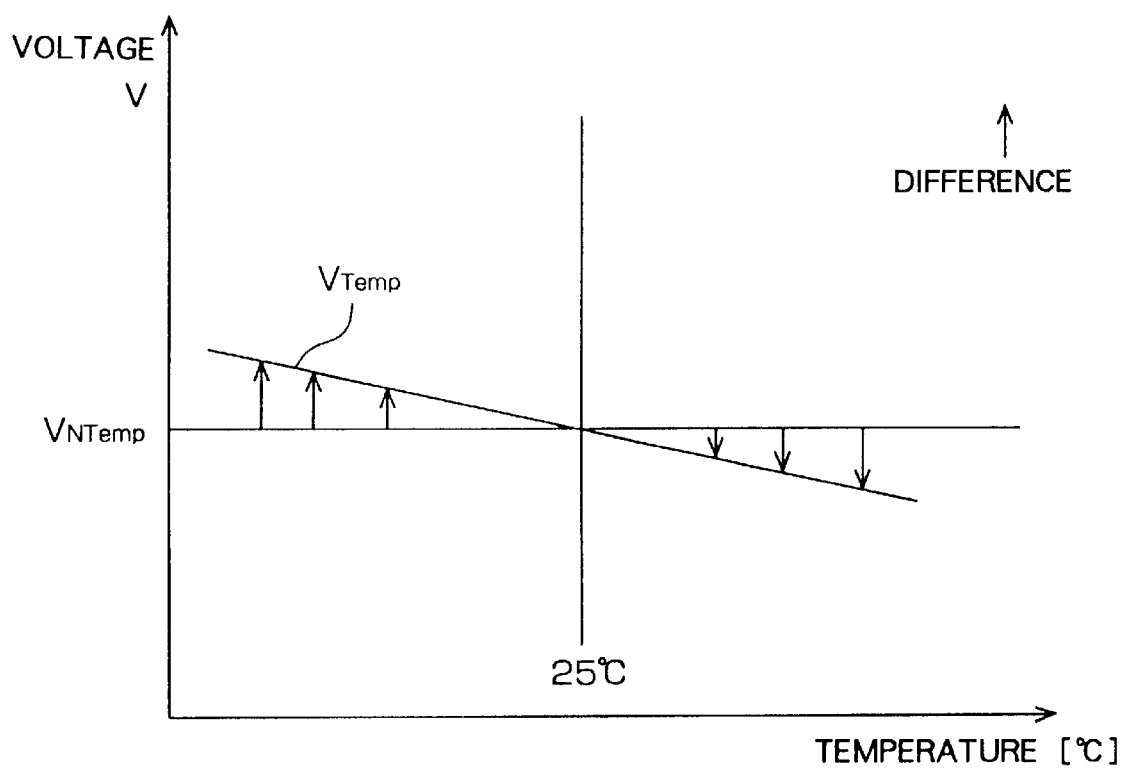
FIG. 27 shows the voltage difference signal obtained by subtracting from a detected voltage signal $V_{Temp}$ a set voltage signal having a voltage level equal to that of a predetermined detected voltage signal $V_{Temp}$.

Furthermore, by processing the detected voltage signal $V_{Temp}$, the set voltage, and the output voltage signal in FIG. 25 in the following manner, a voltage signal is obtained which has a voltage varying along a curve illustrated in FIG. 26 in response to the variation of the oscillating part temperature. Specifically, the detected voltage signal $V_{Temp}$ and the set voltage signal are combined in the manner such that the set voltage (having a voltage level equal to the predetermined detected voltage $V_{NTemp}$) is subtracted from the detected voltage of the detected voltage signal $V_{Temp}$. As a result, a voltage difference signal illustrated in FIG. 27 is obtained. Next, the output voltage signal in FIG. 25 and the voltage difference signal in FIG. 27 are combined in the manner such that the voltage level of the voltage difference signal (FIG. 27) is subtracted from the voltage level of the output voltage signal (FIG. 25). By the above-mentioned operation, the voltage signal having a voltage varying along a negative-coefficient cubic curve in response to the variation of the oscillating part temperature is obtained as illustrated in FIG. 26.

As described above, the quartz resonator 21 has the known temperature-frequency variation characteristic. The varicap 22 has the known capacitance-voltage characteristic. The oscillation circuit 2 has the known capacitance-frequency variation characteristic. This means that the varicap control voltage signal $V_{VR}$ required at a given temperature is known.

Therefore, the voltage signal (FIG. 26) varying along the negative-constant cubic curve in response to the variation of the oscillating part temperature is converted into the converted voltage signal, for example, by amplification at a predetermined amplification factor. The converted voltage signal is used as the varicap control voltage signal $V_{VR}$.

In this embodiment, after the converted voltage signal $V_{LOAD}$ is subtracted from the basic voltage signal $V_{offset}$, the voltage difference signal representative of the voltage difference ($V_{Temp}-V_{NTemp}$) between the detected voltage signal $V_{Temp}$ and the set voltage signal (having the voltage level equal to the predetermined detected voltage $V_{NTemp}$) is further subtracted. As a consequence, the voltage signal varying along the negative-coefficient cubic curve in response to the variation of the oscillating part temperature is obtained. Basically, however, the order of the above-mentioned steps can be modified as far as the following equation is satisfied:

$$V_{VR}=V_{offset}+(V_{NTemp}-V_{Temp}-V_{LOAD}). \tag{3}$$

In the embodiment described above, the set voltage signal producing unit is required which produces the set voltage signal (having the voltage level equal to the predetermined detected voltage $V_{NTemp}$). The set voltage signal producing unit may be or may not be contained in either of the temperature detecting circuit 3 and the temperature characteristic compensating circuit 4.

In order to convert the voltage signal varying along the negative-coefficient cubic curve in response to the variation of the oscillating part temperature into the varicap control voltage signal $V_{VR}$, any appropriate operation such as amplification may be carried out for an entirety or a part of the second term in the right side of Equation (3). This is selected in conformity with a circuit design of the oscillation circuit 2.

With respect to the detected voltage signal $V_{Temp}$ produced by the temperature detecting circuit 3 and having any desired negative linear coefficient, it is possible to adjust the voltage level of the detected voltage signal $V_{Temp}$ for each different temperature by selecting the resistance value of the resistor contained in the temperature detecting circuit 3, as described in the foregoing.

Therefore, by adjusting the element contained in the temperature detecting circuit 3, the predetermined detected voltage $V_{NTemp}$ is given a voltage level equal to the predetermined varicap control voltage (having the voltage level equal to the basic voltage of the basic voltage signal $V_{offset}$) (namely, $V_{NTemp}=V_{offset}$). The set voltage signal producing unit for producing the set voltage (having the voltage level equal to the predetermined detected voltage $V_{Temp}$) is no longer required. This contributes to miniaturization of the circuit.

In case where the set voltage signal (having the voltage level equal to the predetermined detected voltage $V_{Temp}$) is adjusted to be equal in voltage level to the predetermined varicap control voltage (equal to the voltage level represented by the basic voltage signal $V_{offset}$), Equation (3) can be rewritten into:

$$V_{VR}=V_{offset}+(V_{offset}-V_{Temp}-V_{LOAD}). \qquad (4)$$

In this case, the description about conversion such as amplification described in conjunction with Equation (3) also applies.

Figure 28:
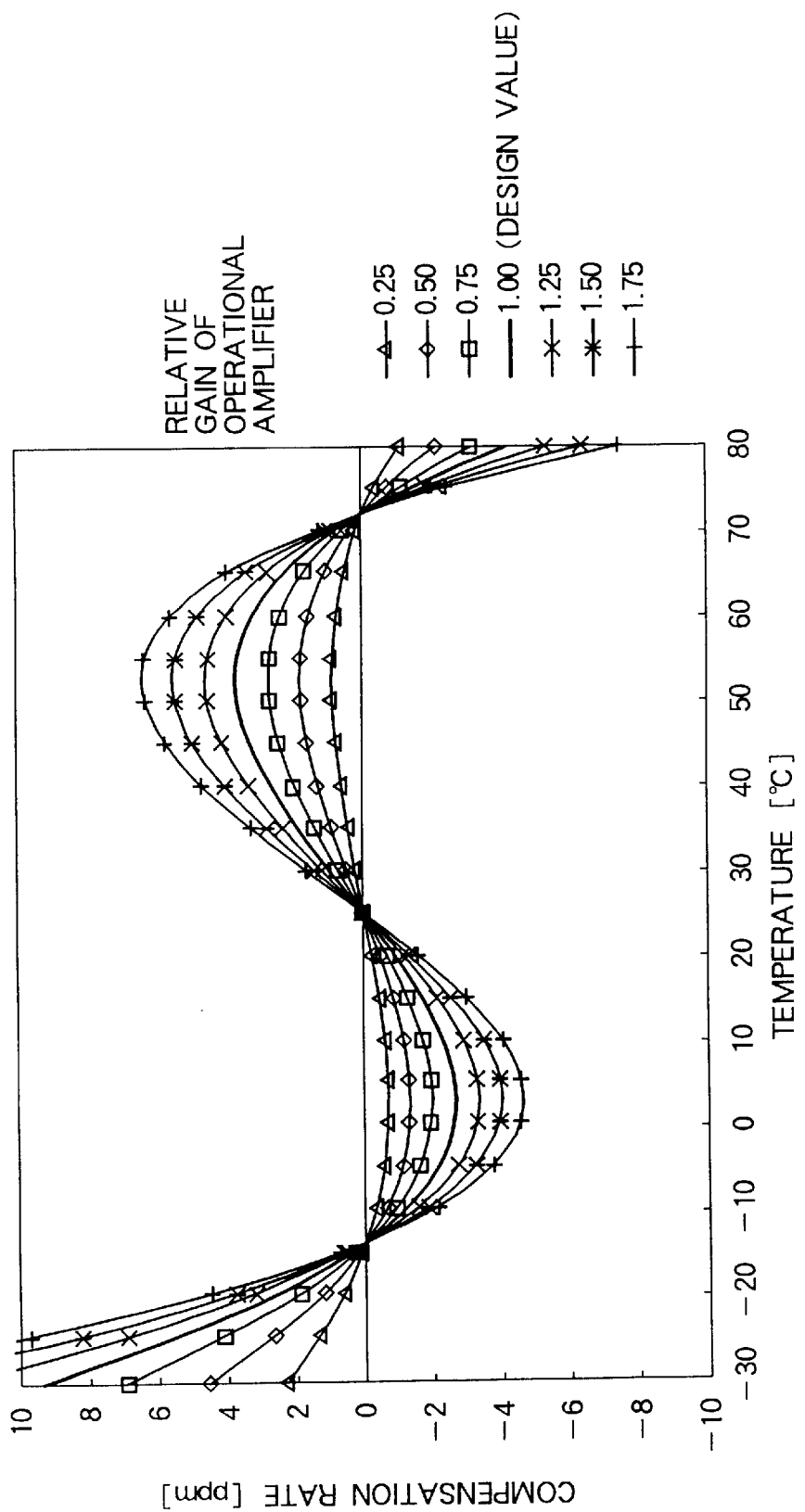
FIG. 28 shows the variation of the compensation rate when the varicap control voltage signal is amplified as a whole.

Referring to FIG. 28, by modifying a gain of an amplifying circuit upon conversion into the varicap control voltage signal $V_{VR}$, it is possible to adjust fluctuation of the capacitance-voltage characteristic of the varicap 22 and various characteristics of other elements and circuits.

In order to deal with the fluctuation of the angle of the quartz resonator, adjustment can be carried out in the following manner.

Figure 29:
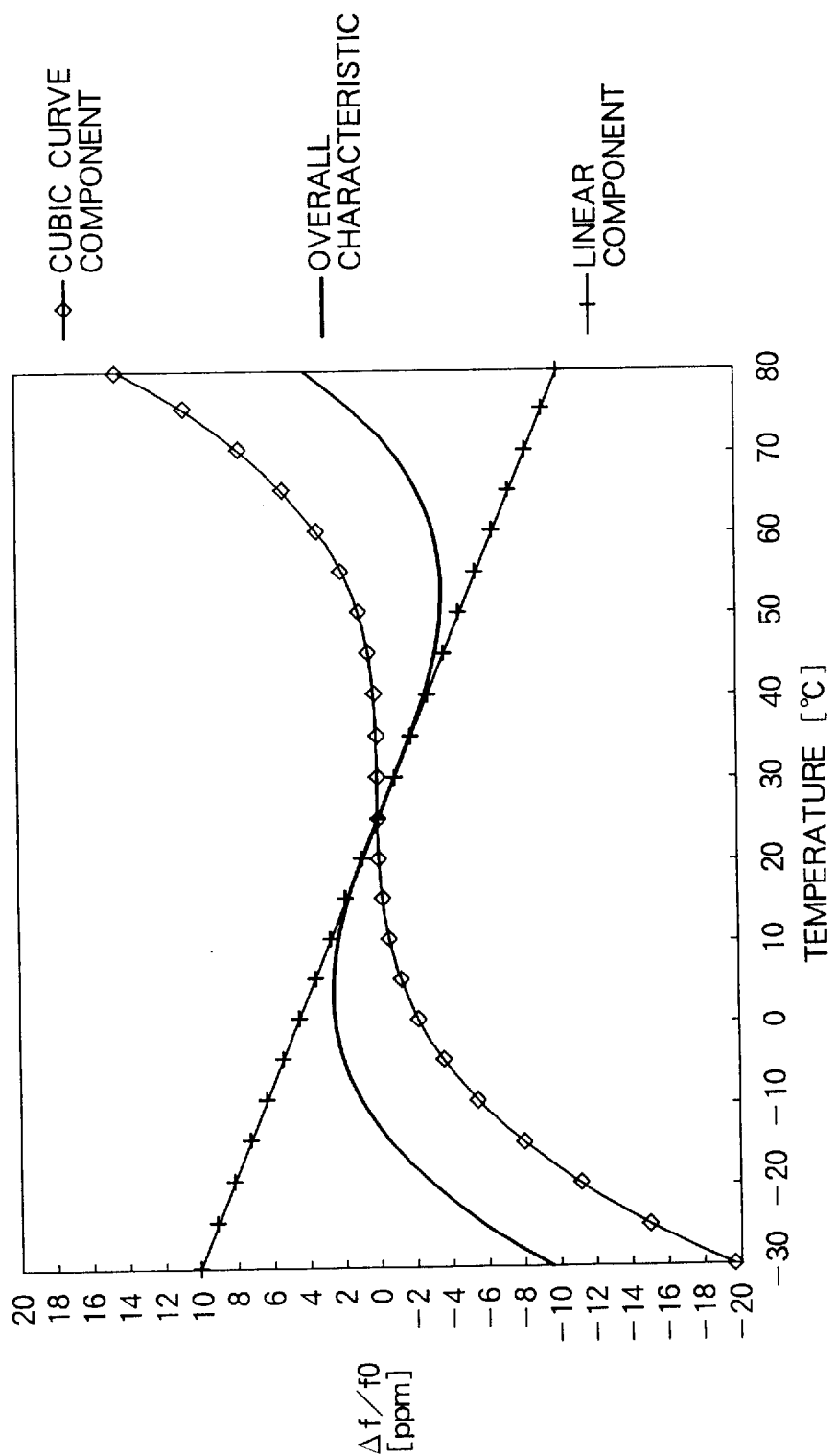
FIG. 29 shows the temperature-frequency variation characteristic of the +2' AT-cut quartz resonator in FIG. 7 with a linear component and a curve component separated.

Referring to FIG. 29, the temperature characteristic of the AT-cut quartz resonator having a cutting angle of +2' can be separated into a linear component having a particular gradient and a cubic curve component without any peak value.

The linear component can be approximated by a gradient obtained by differentiating the temperature characteristic around 25° C. As regards the cubic curve component, it is assumed that the quartz resonator has no defect such as abnormal spurious component. In this event, a substantially similar curve is drawn for the AT-cut quartz resonator of any angle as far as fluctuation in cutting angle falls within a range of ±2' for the +2' AT-cut quartz resonator.

Figure 30:
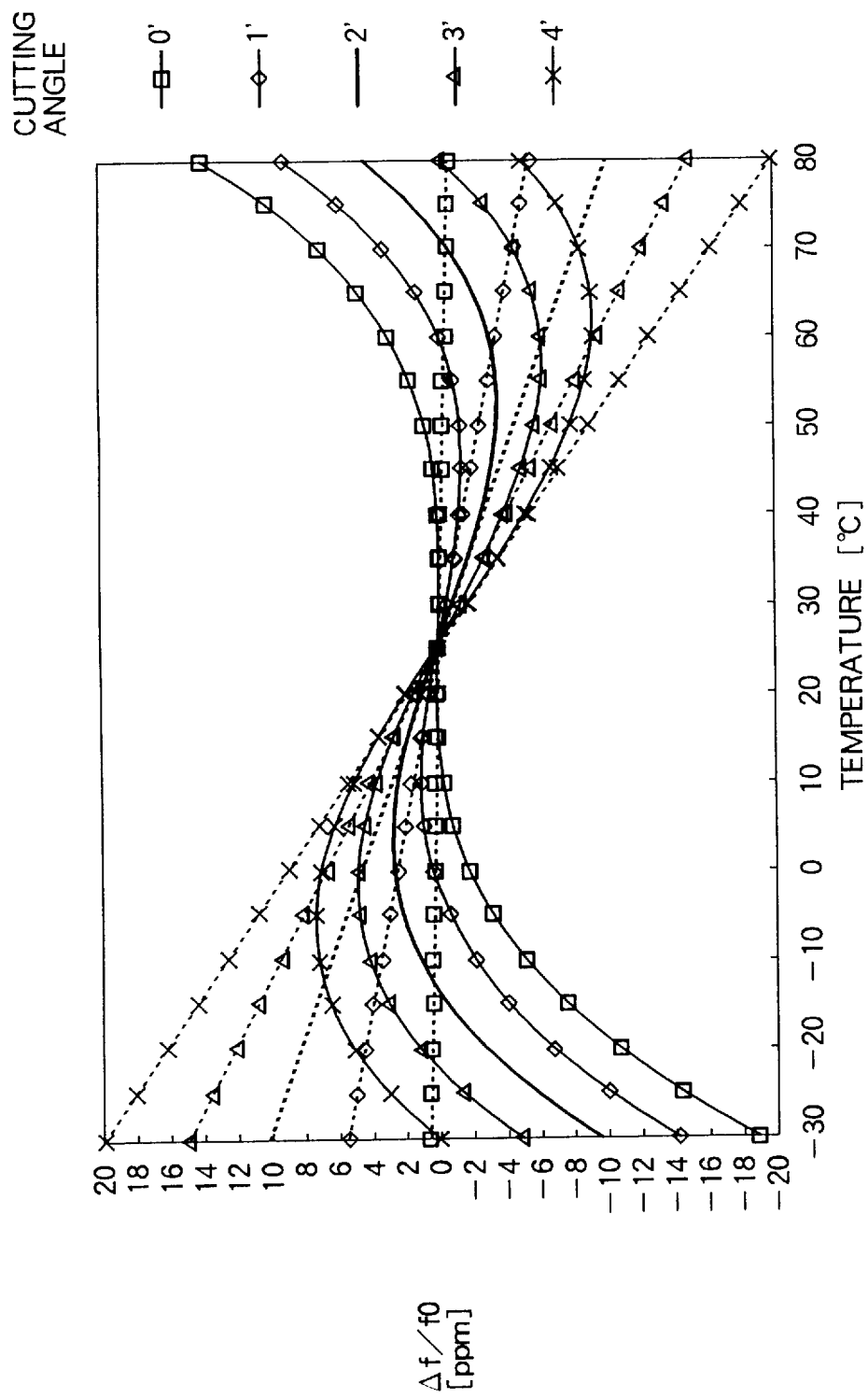
FIG. 30 shows the temperature-frequency variation characteristics after the linear component in FIG. 29 alone is changed and then combined with the curve component.

Based on the linear component and the curve component obtained from the temperature characteristic of the +2' AT-cut quartz resonator, the linear component alone is varied in the following manner to be combined with the curve component. A resultant cubic curve varies as illustrated in FIG. 30. Specifically, for the AT-cut quartz resonator of each cutting angle, the linear component is extracted which has the gradient obtained by differentiating the temperature characteristic curve around the room temperature. Next, the linear component having each gradient is combined with the cubic curve component without any peak value. A resultant cubic curve is substantially coincident with the temperature characteristic of the AT-cut quartz resonator of each cutting angle.

Figure 31:
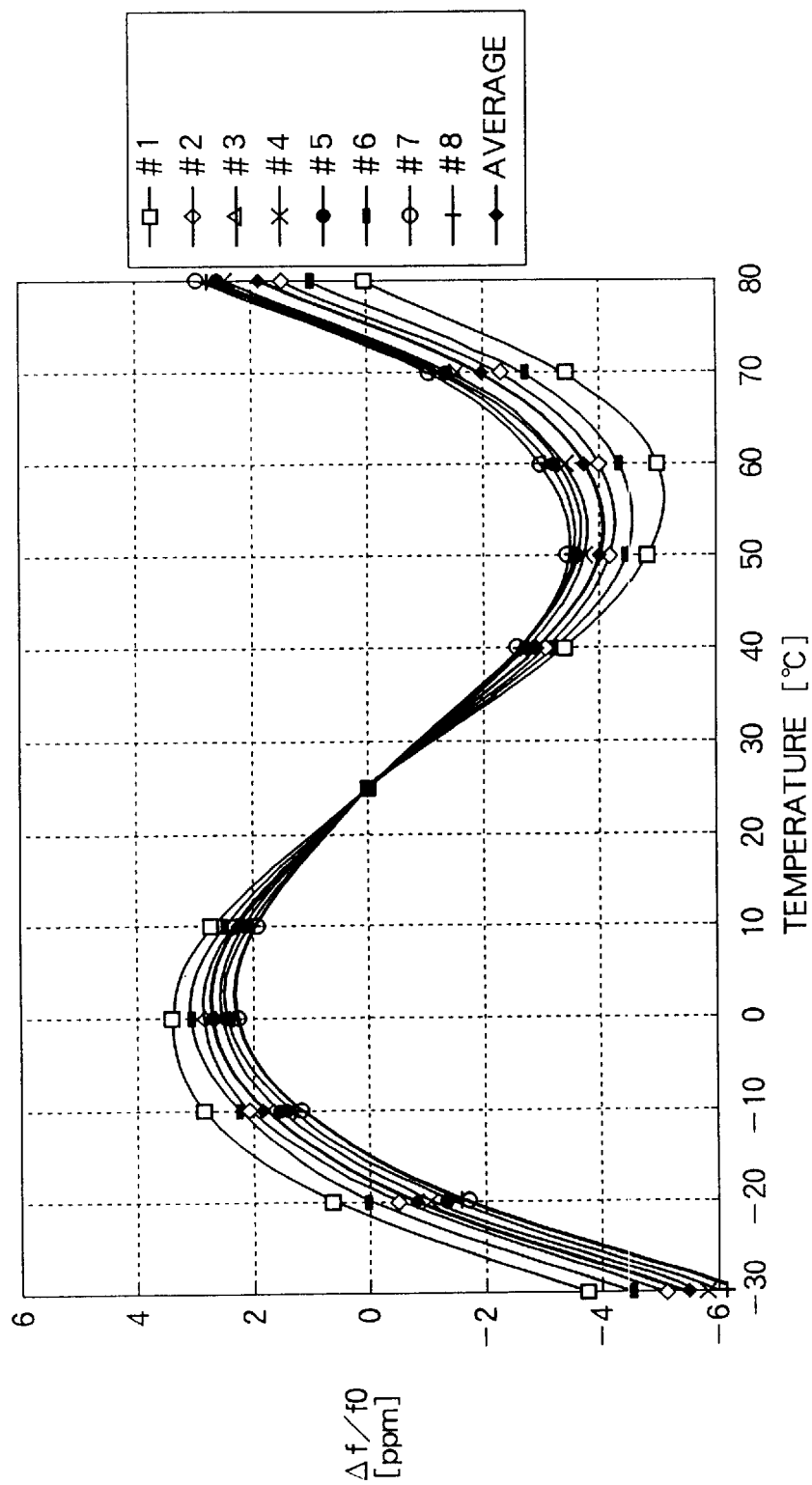
FIG. 31 shows measured temperature-frequency variation characteristics of several samples of the +2' AT-cut quartz resonator with fluctuation in cutting angles together with an average characteristic.
Figure 32:
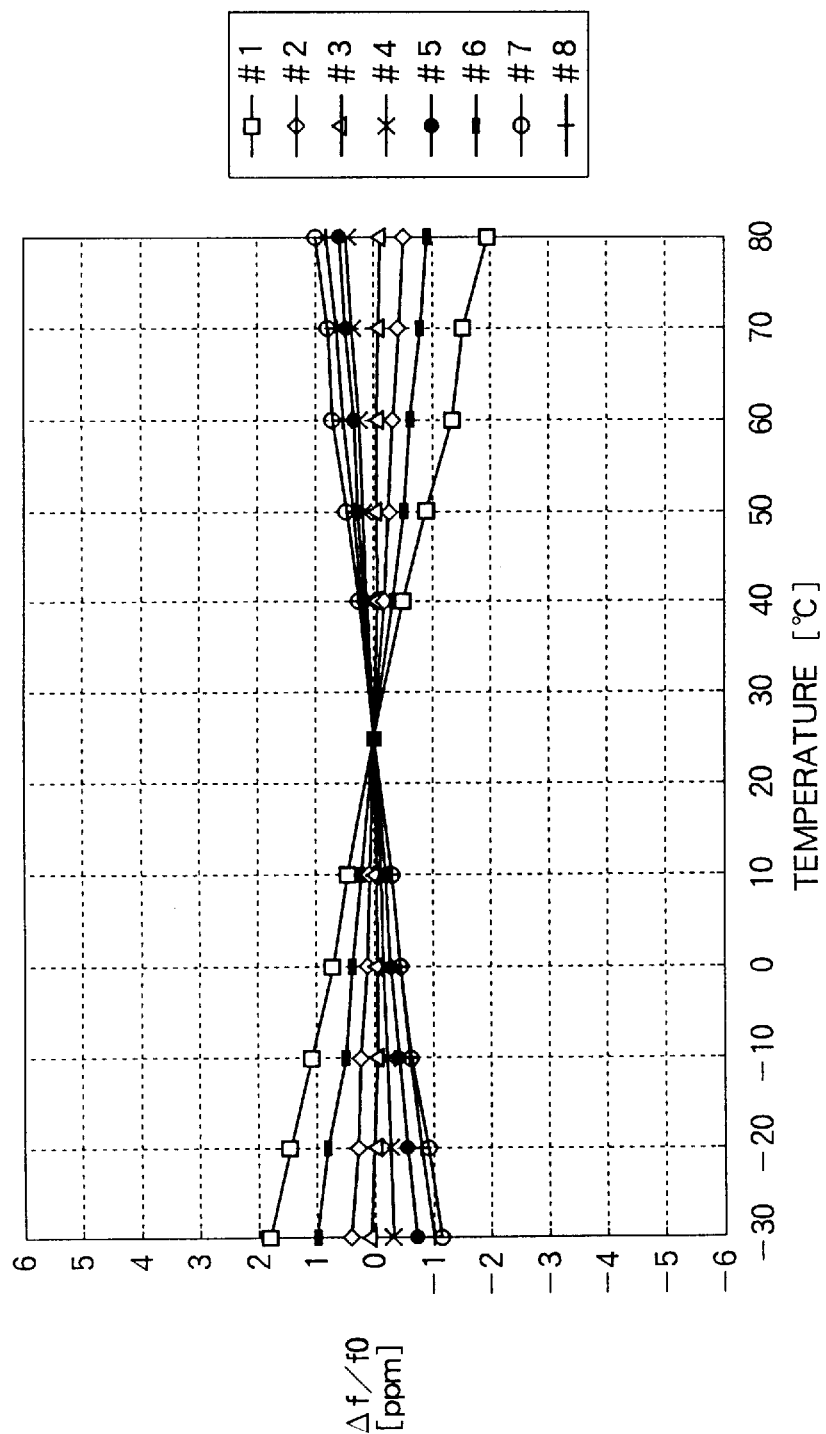
FIG. 32 shows an offset from the average characteristic in FIG. 31 for each of the samples.
Figure 33:
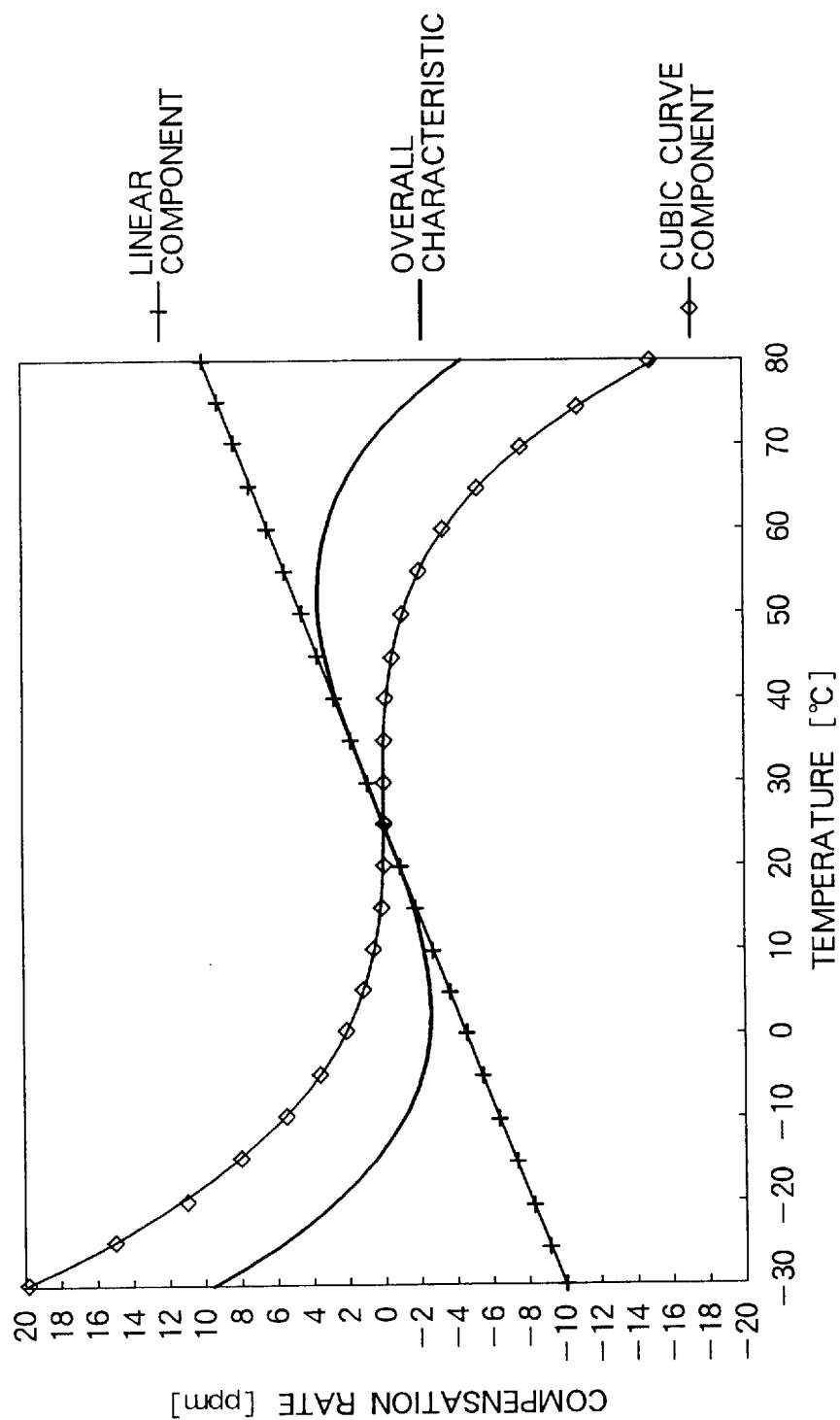
FIG. 33 shows the compensation rate for the +2' AT-cut quartz resonator with a linear component and a curve component separated.

In other words, if the oscillator is designed to use the AT-cut quartz resonator of a cutting angle of +2' and that the AT-cut quartz resonator has fluctuation in cutting angle, the fluctuation can be cancelled by modifying the gradient of the linear component, for example, by amplification. For a better understanding, the foregoing will be described in another aspect with reference to FIGS. 31 and 32. Reference to FIG. 31, the temperature characteristic of the AT-cut quartz resonator is plotted for different cutting angles around +2'. An abscissa and an ordinate represent the temperature and the frequency deviation ratio, respectively. FIG. 31 can be understood to represent fluctuation of the temperature characteristic of the AT-cut quartz resonator of a cutting angle of about +2'. On the other hand, the average frequency deviation ratio for the different cutting angles shown in FIG. 31 is calculated. Referring to FIG. 32, the offset from the average frequency deviation ratio is obtained for each cutting angle as plotted in the figure. As seen from FIG. 32, it is understood that the offset from the average frequency deviation ratio for each cutting angle varies along a substantially straight line. In other words, the offset from the average frequency deviation ratio can be amended by adjusting the gradient of the straight line. Although the offset from the average frequency deviation ratio is described above, amendment may be carried out by the use of the offset from the desired angle (+2').

Figure 34:
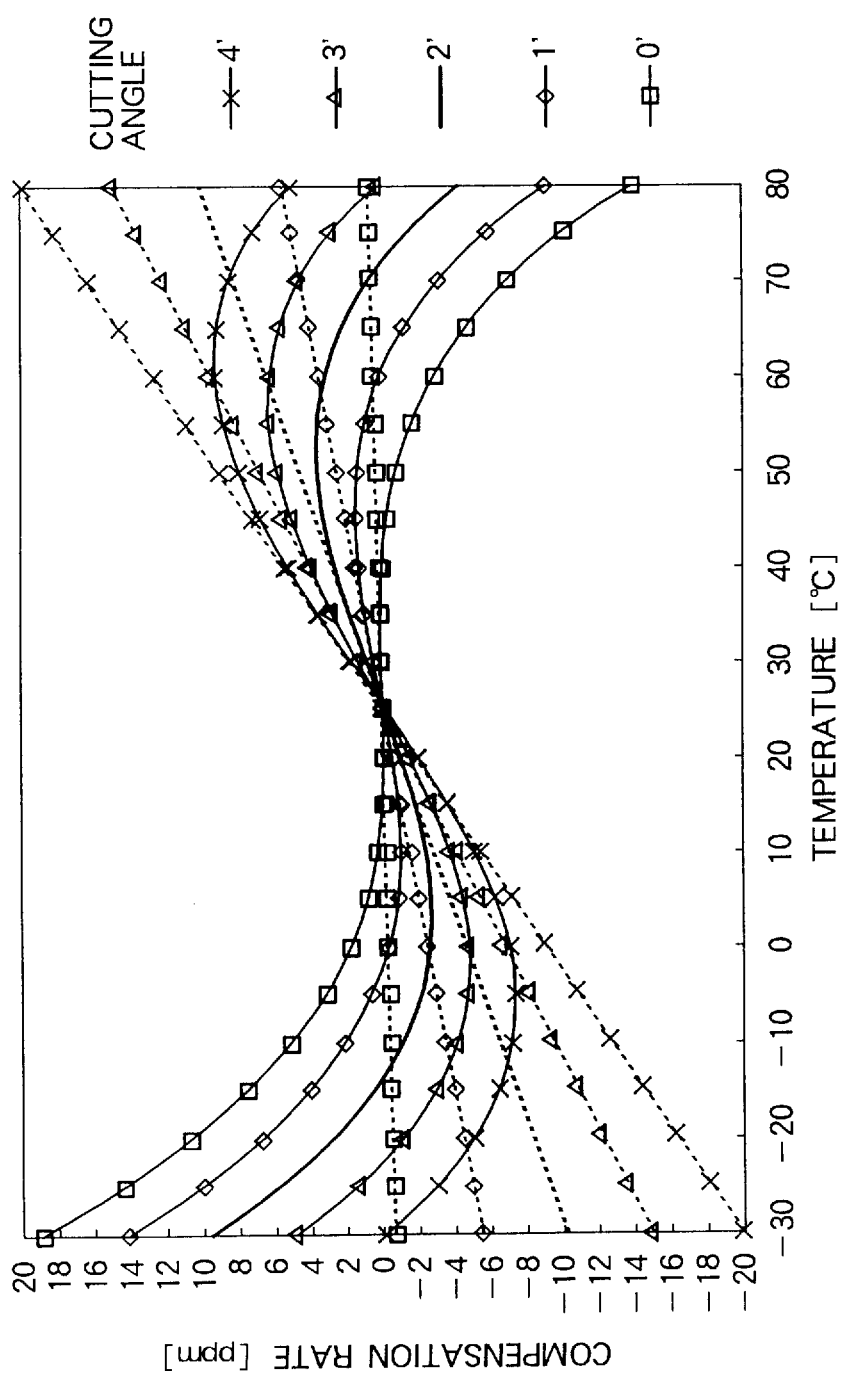
FIG. 34 shows the compensation rates after the linear component in FIG. 33 alone is changed and then combined with the curve component.

As will be understood from the foregoing, the linear component or gradient (FIG. 33), namely, the detected voltage signal $V_{Temp}$ in Equations (3) and (4) is subjected to amplification so that fluctuation in cutting angle of the quartz resonator can be dealt with as shown in FIG. 34. In FIG. 34, the varicap control voltage characteristic is shown in terms of the frequency deviation ratio (ppm) when the amplification factor of the detected voltage signal $V_{Temp}$ alone is varied in the oscillator designed to use the AT-cut resonator having a cutting angle of +2'.

In order to assure the adjustment of the set voltage signal (having the voltage level equal to the predetermined detected voltage $V_{NTemp}$) to the voltage level equal to the predetermined varicap control voltage (having the voltage level equal to the basic voltage of the basic voltage signal $V_{offset}$), the temperature detecting circuit 3 may be connected to a detected temperature offset adjusting circuit 5 comprising a detected temperature offset adjusting element 51 such as a variable resistor.

With the detected temperature offset adjusting circuit 5, it is possible to suppress the influence of the fluctuation of circuit elements in the temperature detecting circuit 3.

In order to increase an accuracy of the basic voltage signal $V_{offset}$ produced by the basic voltage signal producing unit in the temperature-compensated quartz oscillator of this embodiment, the basic voltage signal producing unit may be connected to a control voltage offset adjusting circuit 6 comprising a control voltage offset adjusting element 61 such as a variable resistor.

By the use of the control voltage offset adjusting circuit 6, it is possible to adjust the oscillation frequency to the predetermined frequency even if the oscillation frequency is deviated from the predetermined frequency.

Figure 35:
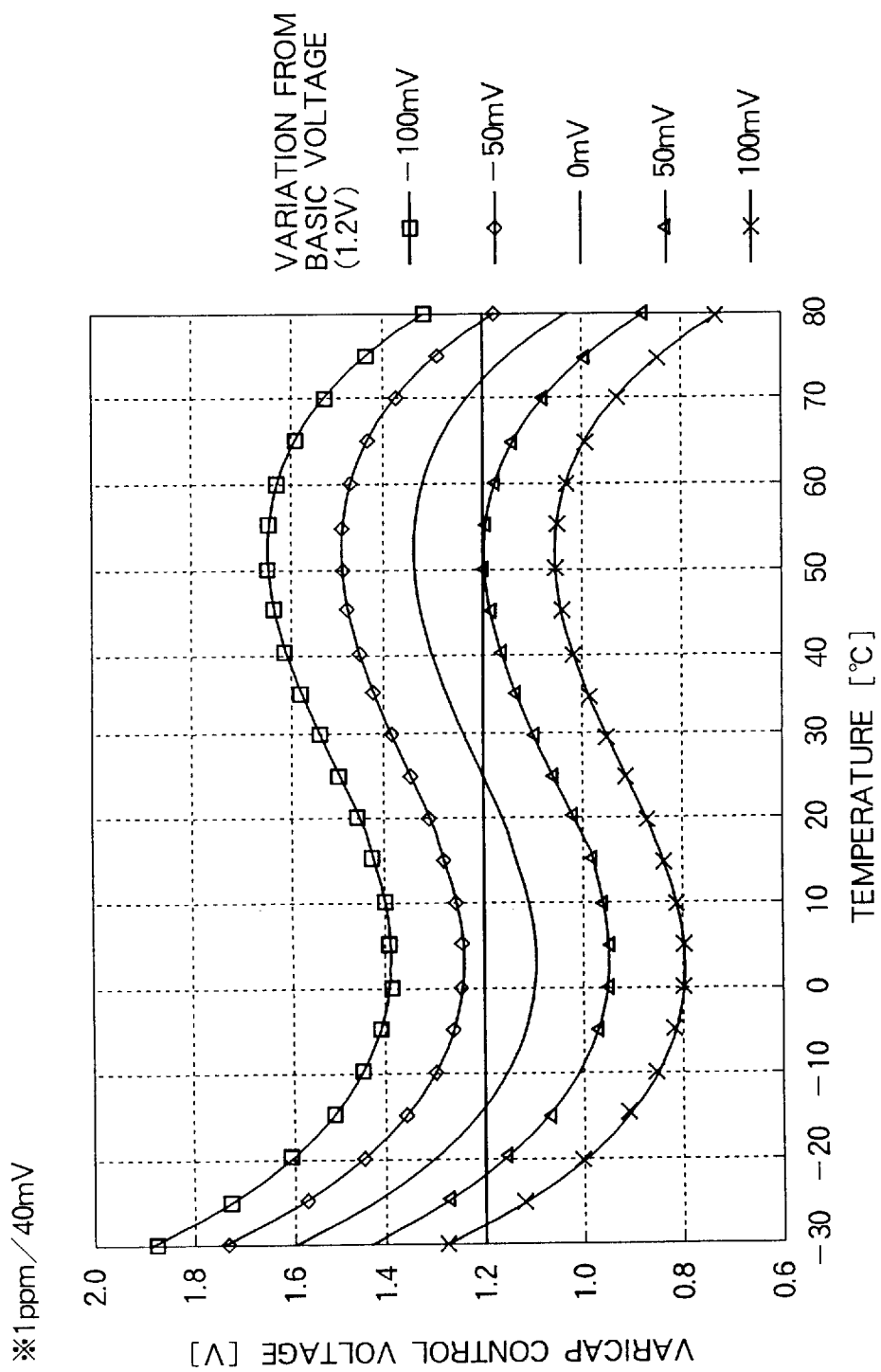
FIG. 35 shows the variation of the varicap control voltage signal when a basic voltage signal $v_{offset}$ is varied.
Figure 36:
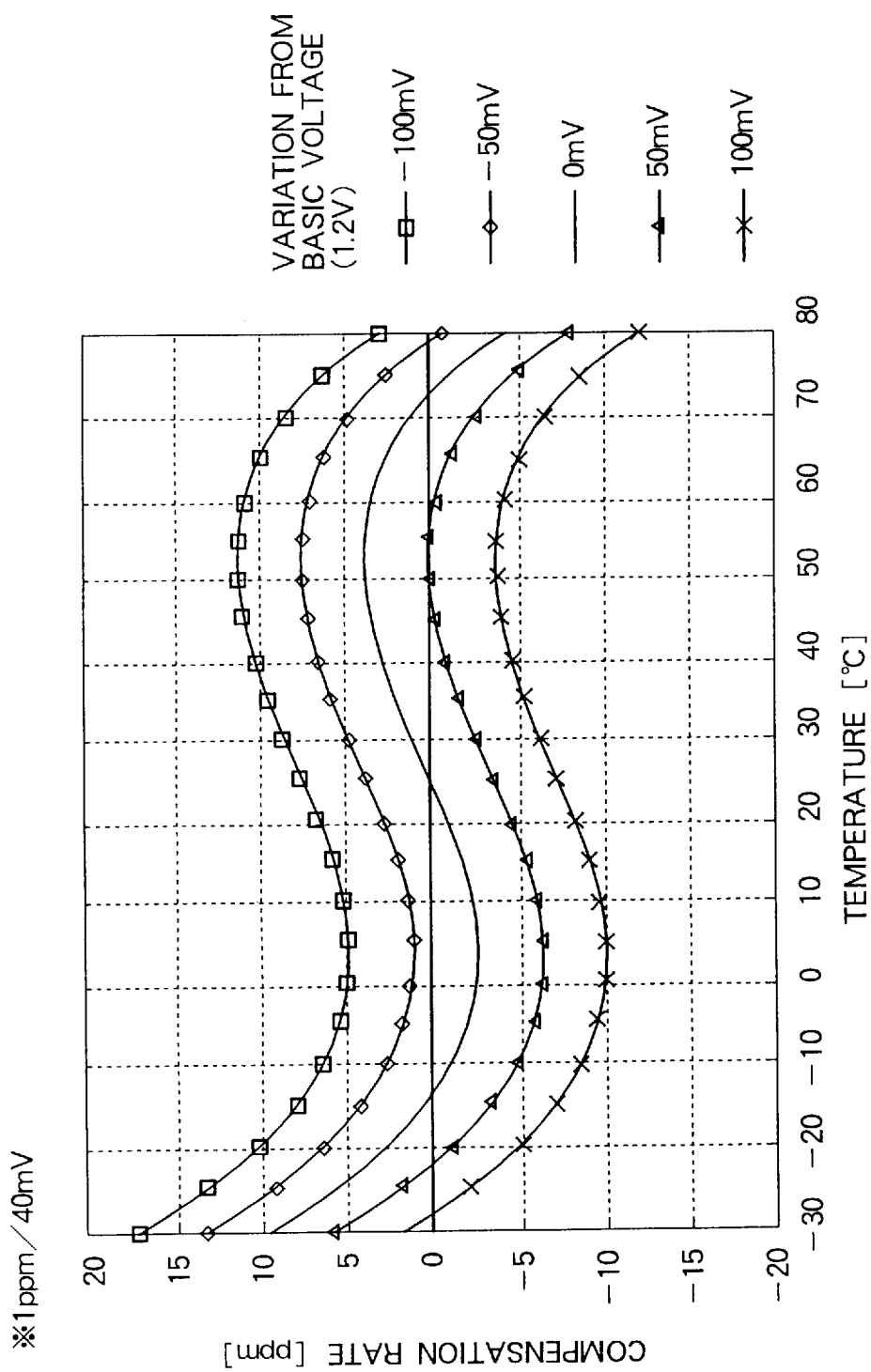
FIG. 36 shows the compensation rate corresponding to FIG. 35.

Referring to FIG. 35, if the basic voltage signal $V_{offset}$ is changed, the varicap control voltage signal $V_{VR}$ is varied. As seen from the figure, by varying the basic voltage signal $V_{offset}$, the varicap control voltage signal $V_{VR}$ can be parallel-shifted or translated by a level corresponding to a particular voltage. As a consequence, the compensation rate (ppm) of the temperature compensation for the oscillation circuit 2 can be uniformly changed by a particular level as shown in FIG. 36. Accordingly, even if the oscillation frequency is offset from the predetermined frequency as an initial design value, the oscillation frequency can be adjusted to the predetermined frequency by adjusting the basic voltage signal $V_{offset}$ in the control voltage offset adjusting circuit 6.

The similar effect can be obtained by the above-mentioned detected temperature offset adjusting circuit. Specifically, when the predetermined detected voltage $V_{NTemp}$ at the predetermined temperature is increased or decreased by the particular level in the detected temperature offset adjusting circuit, the gradient of the detected voltage signal $V_{Temp}$ itself is unchanged so that the similar effect is obtained.

The temperature-compensated quartz oscillator in this embodiment may further comprise a reference voltage producing unit 7 connected to the stabilized power supply circuit 1 and the first and the second differential amplifiers Amp1 and Amp2. The reference voltage producing unit 7 produces the first and the second reference voltage signals $V_{Ref1}$ and $V_{Ref2}$ representative of the first and the second reference voltages, respectively.

In a simplest form, the reference voltage producing unit 7 comprises a voltage dividing circuit arranged between the stabilized power supply circuit and ground. For example, if two reference voltage signals are required, the voltage dividing circuit has at least three resistors and produces at least two different voltages from two connection plates. In this case, one of the two different voltages which has a greater voltage level is used as the second reference voltage while the other one having a smaller voltage level is used as the first reference voltage. If the number of the reference voltage signals required is increased, the voltage dividing circuit comprises an increased number of the resistors.

With the reference voltage producing unit 7, even if the cutting angle of the principal surface of the quartz resonator is slightly offset, the first and the second reference voltage signals $V_{Ref1}$ and $V_{Ref2}$ can be easily modified and readily adjusted after designing the quartz oscillator.

It is supposed that all of the resistors included in the various sections of the temperature-compensated quartz oscillator described above are variable resistors which is capable of continuously changing the resistance value. In this case, it is possible to easily adjust the fluctuation which is found out in a test after completion of design and which results from those sections having variable resistors.

As the variable resistors of the type, use can be made of a thin film resistor. The thin film resistor generally used in an integrated circuit can be adjusted in resistance value by laser trimming, anode forming trimming, scribe trimming, and so on.

Alternatively, a resistor combining circuit comprising a plurality of resistors can be used as the variable resistor. The resistance value can be modified by exchanging the resistors contained in the resistor combining circuit, inserting the resistor in a connection line, short-circuiting opposite ends of terminals of the resistor, and disconnecting one end of the terminals of the resistor. Alternatively, the resistor combining circuit may comprise a resistor having one end preliminarily connected and the other end kept released. Upon adjusting the resistance value, the other end is connected to modify the resistance value.

In this embodiment, the electric current flowing through the resistor $R_{LOAD}$ is the combined current I (=I1–I2) obtained by subtracting the collector current I2 of the second differential amplifier from the collector current I1 of the first differential amplifier. On the contrary, the combined current I (=I2–I1) may be obtained by subtracting the collector current I1 of the first differential amplifier from the collector current I2 of the second differential amplifier.

In this case, the operation of producing the varicap control voltage signal $V_{VR}$ or the voltage signal antecedent thereto (namely, having the predetermined varicap control voltage when the oscillating part temperature is the predetermined temperature and varying, in response to the variation of the oscillating part temperature, along the negative-coefficient cubic curve with the inflection point at the predetermined varicap control voltage) is different.

For example, the operation is as follows. At first, the combined current I (=I2–I1) varying in response to the variation of the oscillating part temperature is converted by the resistor into the voltage signal which has a zero voltage when the oscillating part temperature is the predetermined temperature and which varies along the negative-coefficient cubic curve (hereinafter called a first cubic curve) without any peak value.

Next, the basic voltage signal $V_{offset}$ is uniformly added to the first cubic curve to produce a second cubic curve which has a voltage level indicated by the basic voltage signal $V_{offset}$ when the oscillating part temperature is the predetermined temperature and which has the negative cubic coefficient without any peak value.

Then, the detected voltage signal $V_{Temp}$ is subtracted from the second cubic curve. As a result, a signal is obtained which varies in the manner similar to the signal produced by the varicap control voltage signal producing unit.

Herein, amplification upon producing the varicap control voltage signal is similar to that described above.

In the foregoing, description has been made about the case where each circuit section is formed by bipolar transistors. However, instead of the bipolar transistors, each circuit section may comprise FETs (Field Effect Transistors) such as MOS transistors to carry out signal processing operation.

Next referring to FIGS. 37 and 38, specific embodiments of this invention will be described.

First Specific Embodiment

Figure 37:
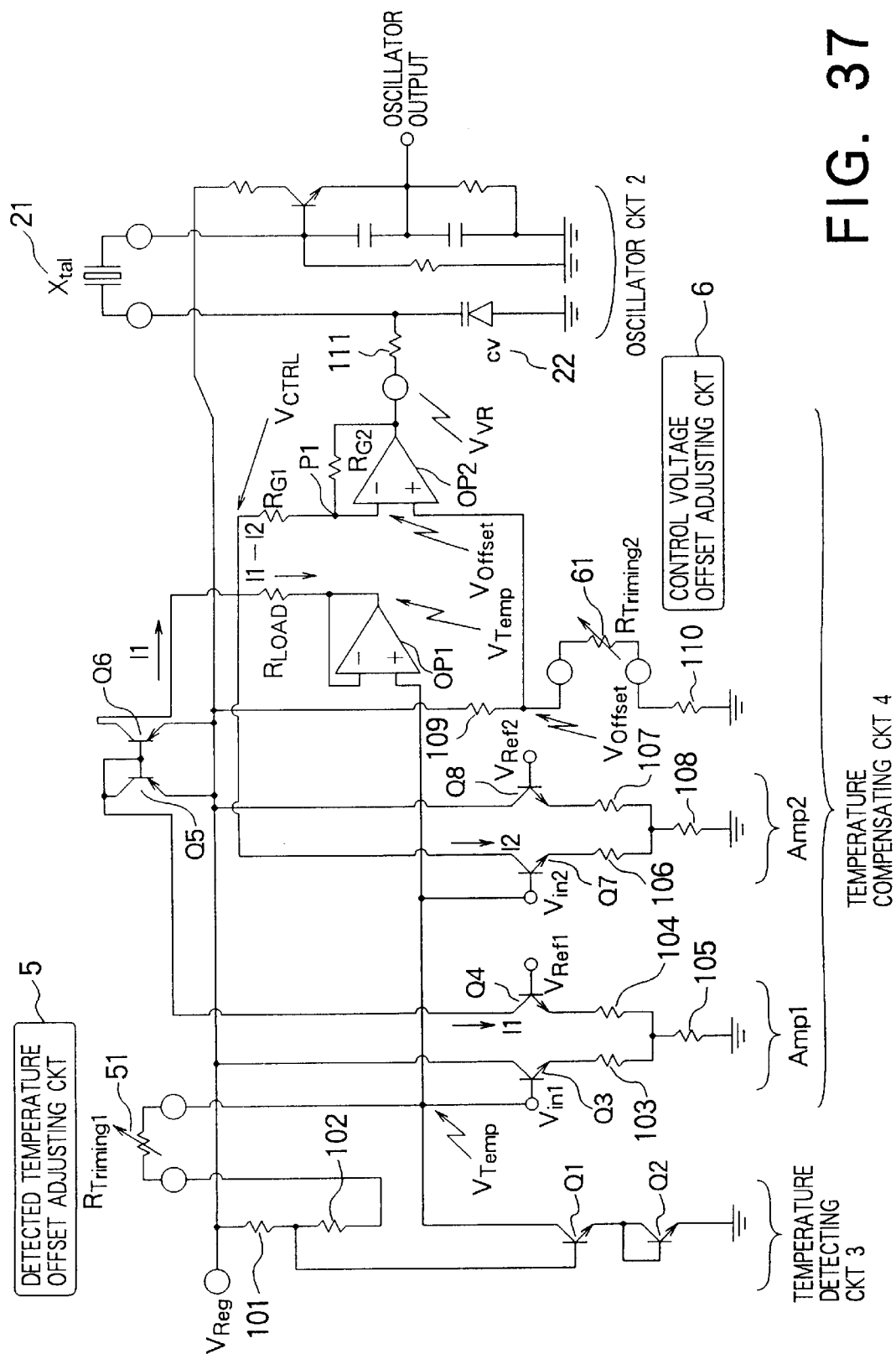
FIG. 37 is a circuit diagram of a temperature-compensated quartz oscillator according to a first embodiment of this invention.

Referring to FIG. 37, a temperature-compensated quartz oscillator according to a first embodiment has a circuit structure shown in the figure.

For convenience of illustration, the stabilized power supply circuit 1 is omitted. However, a voltage supplied by the stabilized power supply circuit is depicted at $V_{Reg}$ in FIG. 37.

As illustrated in FIG. 37, the temperature detecting circuit 3 comprises a resistor 101, a transistor Q1, and a transistor Q2. The temperature detecting circuit 3 is connected to the detected temperature offset adjusting circuit 5. The detected temperature offset adjusting circuit 5 comprises the detected temperature offset adjusting element 51 of a variable resistor $R_{Triming1}$, and a resistor 102.

The detected temperature offset adjusting circuit 5 adjusts the detected voltage signal $V_{Temp}$ produced by the temperature detecting circuit 3 so that the predetermined detected voltage $V_{NTemp}$ is equal to the basic voltage of the basic voltage signal $V_{offset}$. As described above, the predetermined detected voltage $V_{NTemp}$ corresponds to the predetermined temperature (25° C. in this embodiment).

The temperature detecting circuit 3 of the above-mentioned structure carries out the operation basically similar to that described above (see FIG. 15).

The detected voltage signal $V_{Temp}$ as an output of the temperature detecting circuit 3 is supplied to the base of the transistor Q3 of the first differential amplifier Amp1 and to the base of the transistor Q7 of the second differential amplifier Amp2. The detected voltage signal $V_{Temp}$ is also supplied to a non-inverted input terminal of an operational amplifier OP1 forming a voltage follower.

The first reference voltage signal $V_{Ref1}$ is supplied to the base of the transistor Q4 of the first differential amplifier Amp1 while the second reference voltage signal $V_{Ref2}$ is supplied to the base of the transistor Q8 of the second differential amplifier Amp2.

Herein, each of the first and the second reference voltage signals $V_{Ref1}$ and $V_{Ref2}$ is selected so as to satisfy the condition described in the foregoing (when $V_{Ref1} < V_{NTemp} < V_{Ref2}$ and $V_{Temp} = V_{NTemp}$, the current I (=I1−I2) flowing through the resistor $R_{LOAD}$ is equal to 0).

Resistors 103, 104, 106, and 107 are equivalent to those described as the resistors $R_{E1}$, $R_{E2}$, $R_{E3}$, and $R_{E4}$ in the foregoing, respectively. Resistors 105 and 108 are equivalent to those described as the resistors $R_{Com1}$ and $R_{Com2}$ in the foregoing, respectively.

The collector current I1 of the transistor Q4 and the collector current I2 of the transistor Q7 are combined into the combined current I (=I1−I2) which is supplied to the resistor $R_{LOAD}$. Specifically, the collector current I1 is introduced to the resistor $R_{LOAD}$ through the first current mirror circuit CM1 composed of the two transistors Q5 and Q6 while the collector current I2 is directly introduced to the resistor $R_{LOAD}$. In the manner similar to that described in the foregoing, the direction of the collector current I1 flowing to the resistor $R_{LOAD}$ is supposed to be positive. Therefore, the combined current I is given by I=I2−I2.

Figure 21:
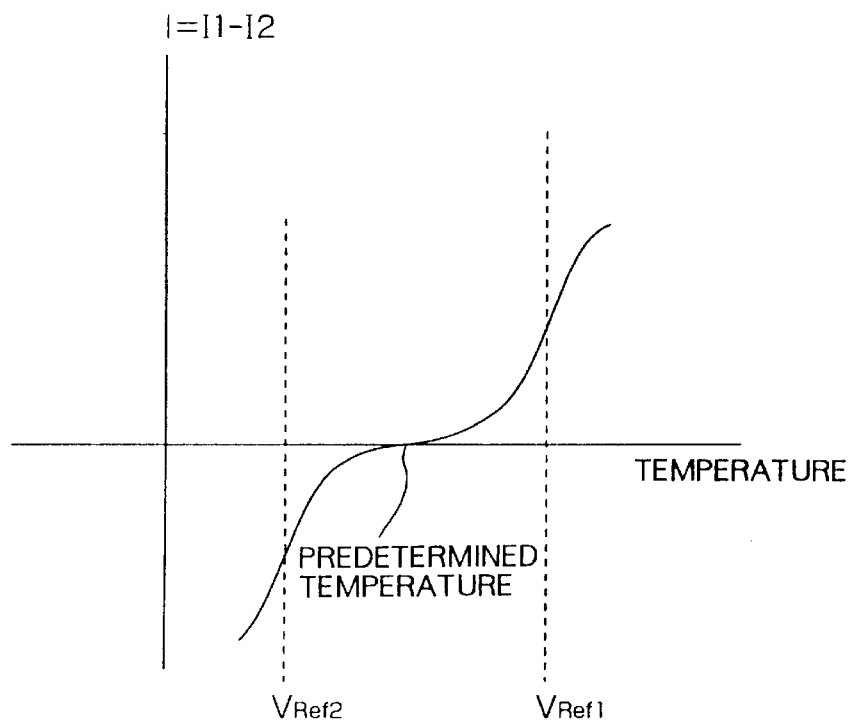
FIG. 21 shows the variation of the combined current in FIG. 20 with respect to the oscillating part temperature.

The combined current I (=I1−I2) varies, in response to the variation of the oscillating part temperature, along the positive-coefficient no-peak cubic curve which has a current value of zero when the oscillating part temperature is the predetermined temperature and which has an inflection point when the current value is equal to zero (see FIG. 21).

The current I (=I1−I2) is supplied to the resistor $R_{LOAD}$ to be converted into the converted voltage signal $V_{LOAD}$. Then, the detected voltage signal $V_{Temp}$ and the converted voltage signal $V_{LOAD}$ is combined ($V_{Temp}+V_{LOAD}$).

The control voltage offset adjusting circuit 6 comprises the control voltage offset adjusting element 61 of a variable resistor $R_{Triming2}$, and resistors 109 and 110. The control voltage offset adjusting circuit 6 is for producing the basic voltage signal $V_{offset}$ to be supplied to the non-inverting input terminal of an inverting amplifier. As described above, the basic voltage signal $V_{offset}$ has a voltage level equal to the predetermined varicap control voltage which is the varicap control voltage at the predetermined temperature. The control voltage offset adjusting circuit 6 of the above-mentioned structure changes the voltage level indicated by the basic voltage signal $V_{offset}$ to adjust the oscillation frequency of the oscillation circuit 2 to a desired frequency (see FIGS. 35 and 36).

The inverting amplifier comprises an operational amplifier OP2 and resistors $R_{G1}$ and $R_{G2}$. The inverting input terminal of the inverting amplifier is supplied through the resistor $R_{G1}$ with a combined voltage signal ($V_{Temp}+V_{LOAD}$) which is a combination of the detected voltage signal $V_{Temp}$ and the converted voltage signal $V_{LOAD}$.

The inverting input terminal of the inverting amplifier is connected to the output terminal of the inverting amplifier through the resistor $R_{G2}$. Thus, the inverting amplifier is fed back in a negative feedback loop.

Accordingly, virtual short-circuiting can be applied between the two input terminals (non-inverting and inverting input terminals) of the inverting amplifier. Therefore, the electric potential of the point P1 is equal to the basic voltage represented by the basic voltage signal $V_{offset}$.

From the above, the varicap control voltage signal $V_{VR}$ produced by the inverting amplifier is given by:

$$V_{VR} = V_{offset} + (V_{offset} - V_{Temp} - V_{LOAD}) \cdot \frac{R_{G2}}{R_{G1}}, \quad (5)$$

where $R_{G2}/R_{G1}$ represents an amplification factor. By adjusting the amplification factor, it is possible to cope with the fluctuation of the capacitance-voltage characteristic of the varicap (see FIG. 28).

In this manner, the varicap control voltage signal $V_{VR}$ (FIG. 26) is produced which varies along the negative-coefficient cubic curve in response to the variation of the oscillating part temperature. The varicap control voltage signal $V_{VR}$ is applied to the varicap 22 through a resistor 111.

When the varicap control voltage signal $V_{VR}$ is applied to the varicap 22, the varicap capacitance is given a desired capacitance. As a result, it is possible to compensate the frequency-temperature characteristic of the quartz resonator 21.

The resistor 111 serves to increase the impedance at the side of the temperature characteristic compensating portion 4 as seen from the oscillation circuit 2 so that a reactance component at the side of the temperature characteristic compensating portion 4 can be neglected.

In this embodiment, fine adjustment is possible after completion of circuit design because of provision of the detected temperature offset adjusting element 51 comprising the variable resistor $R_{Triming1}$ and the control voltage offset adjusting element 61 comprising the variable resistor $R_{Triming2}$.

It is noted here that the detected temperature offset adjusting element 51 and the control voltage offset adjusting element 61 serve to suppress the resulting from the fluctuation in characteristics of the elements in various sections. Therefore, the detected temperature offset adjusting element 51 and/or the control voltage offset adjusting element 61 can be omitted in absence of such fluctuation or when no consideration is required about the influence resulting from such fluctuation.

Second Specific Embodiment

Figure 38:
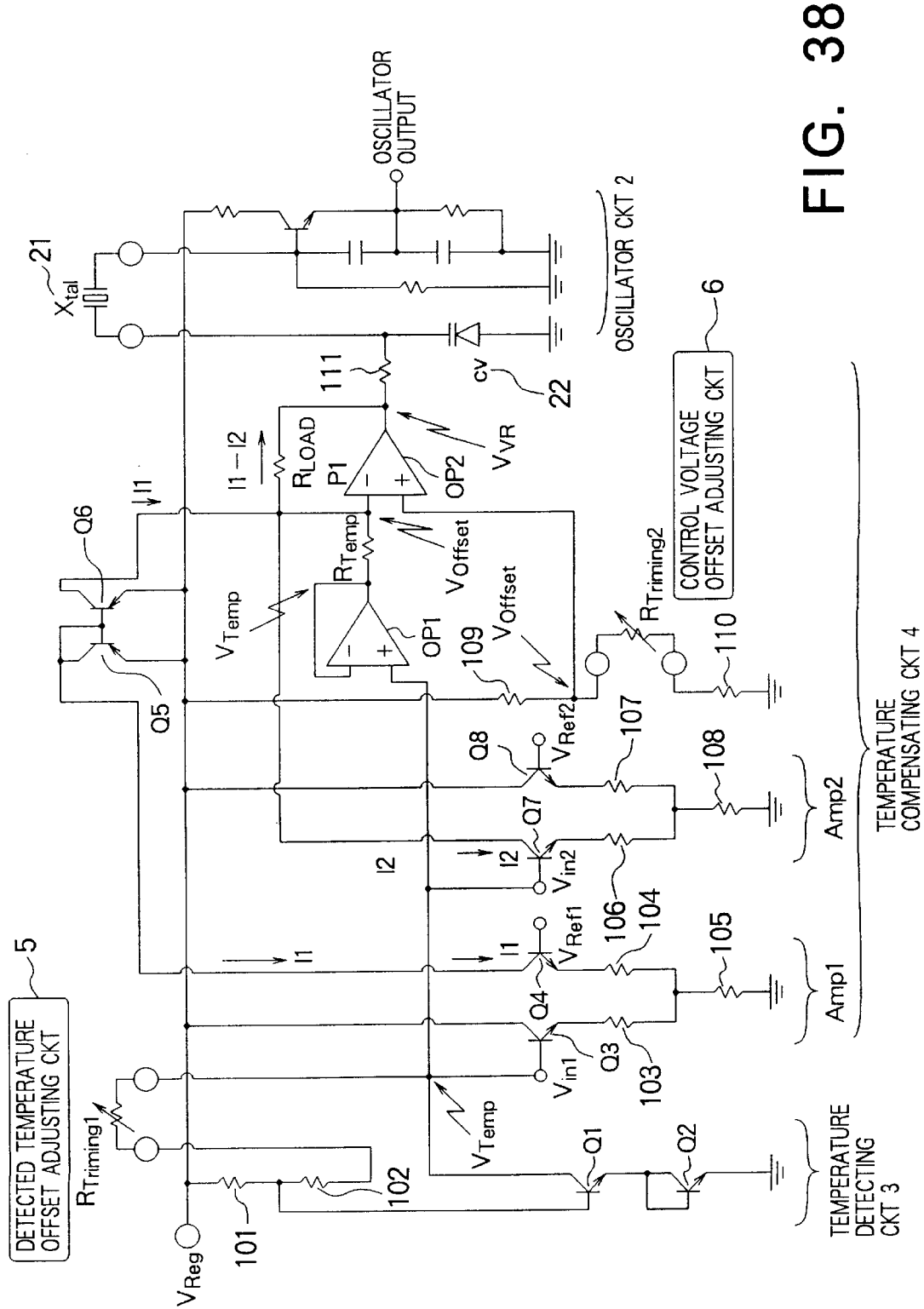
FIG. 38 is a circuit diagram of a temperature-compensated quartz oscillator according to a second embodiment of this invention.

Referring to FIG. 38, a temperature-compensated quartz oscillator according to a second specific embodiment of this invention comprises similar parts designated by like reference numerals.

Like in the first embodiment, the stabilized power supply circuit 1 is omitted in the figure for simplification of illustration. However, the voltage supplied from the stabilized power supply circuit 1 is depicted by $V_{Reg}$ in FIG. 38.

As seen from FIG. 38, the temperature detecting circuit 3, the detected temperature offset adjusting circuit 5, the first differential amplifier Amp1, the second differential amplifier Amp2, the first current mirror circuit CM1 comprising the two transistors Q5 and Q6, the control voltage offset adjusting circuit 6, the voltage follower comprising the operational amplifier OP1, and the resistor 111 are similar in operation to the first embodiment and will not be described any longer.

Specifically, the temperature-compensated quartz oscillator according to the second embodiment is different from the first embodiment in the manner how to produce the varicap control voltage signal $V_{VR}$ by the use of the detected voltage signal $V_{Temp}$, the basic voltage signal $V_{offset}$, and the converted voltage signal $V_{LOAD}$.

Like in the first embodiment, the inverting amplifier in this embodiment comprises the operational amplifier OP2, the resistor $R_{LOAD}$, and the resistor $R_{Temp}$. In the inverting amplifier having the above-mentioned structure, the output terminal and the inverting input terminal of the operational amplifier OP2 are connected through the resistor $R_{LOAD}$. Therefore, virtual short-circuiting is applied between the inverting and the non-inverting input terminals.

Therefore, the electric potential of the point P1 has a voltage level equal to that indicated by the basic voltage signal $V_{offset}$ supplied to the non-inverting input terminal. Herein, the basic voltage signal $V_{offset}$ can be adjusted by the control voltage offset adjusting circuit 6 in the manner similar to the first embodiment. Accordingly, it is possible to cope with the fluctuation of the oscillation frequency of the oscillation circuit 2 (FIGS. 35 and 36).

Based on the fact that the converted voltage signal $V_{LOAD}$ is a product of the resistor $R_{LOAD}$ and the combined current I (=I1−I2), attention is directed to the output voltage produced by the inverting amplifier with the superposing principle applied thereto. Then, the following equation is given:

$$V_{VR} = V_{offset} + (V_{offset} - V_{Temp}) \cdot \frac{R_{LOAD}}{R_{Temp}} - V_{LOAD}, \quad (6)$$

where $R_{LOAD}/R_{Temp}$ represents an amplification factor of the whole inverting amplifier.

When the resistance value of the resistor $R_{Temp}$ is changed, the amplifier factor of the detected voltage signal $V_{Temp}$ can be modified so that the gradient of the detected voltage signal $V_{Temp}$ can be adjusted. Therefore, by adjusting the resistance value of the resistor $R_{Temp}$, it is possible to cope with the fluctuation in cutting angle of the quartz resonator, as described above (FIGS. 29 through 34).

When the amplification factor of the whole inverting amplifier is changed, it is possible to cope with the fluctuation of the capacitance-voltage characteristic of the varicap in the manner similar to the first embodiment (FIG. 28).

As described above, in the second embodiment also, the varicap control voltage signal $V_{VR}$ (FIG. 26) represented by the negative-coefficient cubic curve is produced and applied to the varicap 22 through the resistor 111.

When the varicap control voltage signal $V_{VR}$ is applied to the varicap 22, the varicap capacitance is given a desired capacitance. As a result, it is possible to compensate the frequency-temperature characteristic of the quartz resonator 21.

In this embodiment, fine adjustment is possible after completion of circuit design because of provision of the detected temperature offset adjusting element 51 comprising the variable resistor $R_{Triming1}$ and the control voltage offset adjusting element 61 comprising the variable resistor $R_{Triming2}$.

It is noted here that the detected temperature offset adjusting element 51 and the control voltage offset adjusting element 61 serve to suppress the influence resulting from the fluctuation in characteristics of the elements in various sections. Therefore, the detected temperature offset adjusting element 51 and/or the control voltage offset adjusting element 61 can be omitted in absence of such fluctuation or when no consideration is required about the influence resulting from such fluctuation.

Third Specific Embodiment

Figure 39:
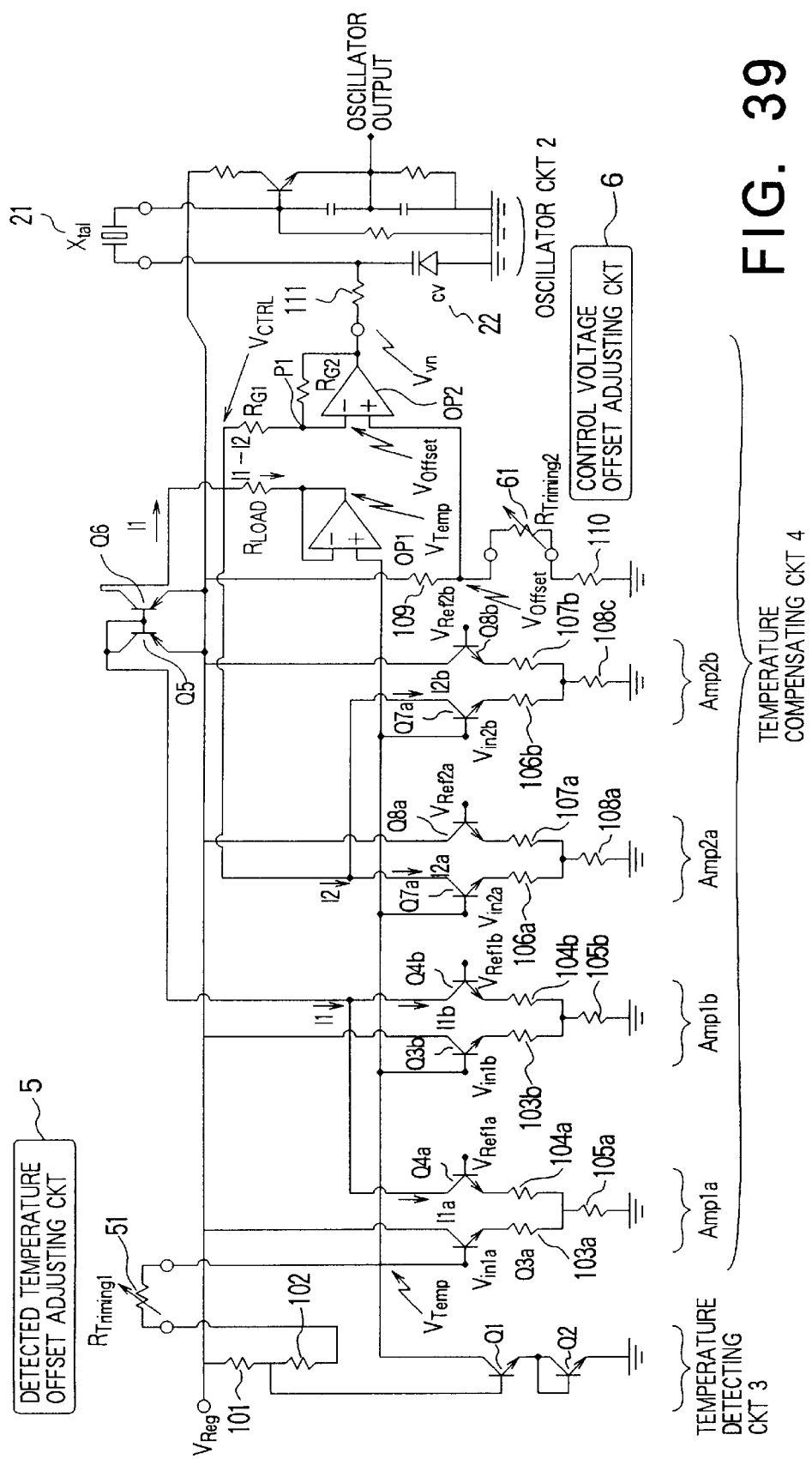
FIG. 39 is a circuit diagram of a temperature-compensated quartz oscillator according to a third embodiment which is a modification of the first embodiment.

Referring to FIG. 39, a temperature-compensated quartz oscillator according to a third embodiment of this invention has similar parts designated by like reference numerals.

The temperature-compensated quartz oscillator of this embodiment is different from the first embodiment in that the first differential amplifier Amp1 comprises two differential amplifiers Amp1a and Amp1b while the second differential amplifier Amp2 comprises two differential amplifiers Amp2a and Amp2b. With this structure, by appropriately determining the reference voltage supplied to each differential amplifier, the temperature-compensated quartz oscillator has a widened compensatable temperature range.

Figure 40:
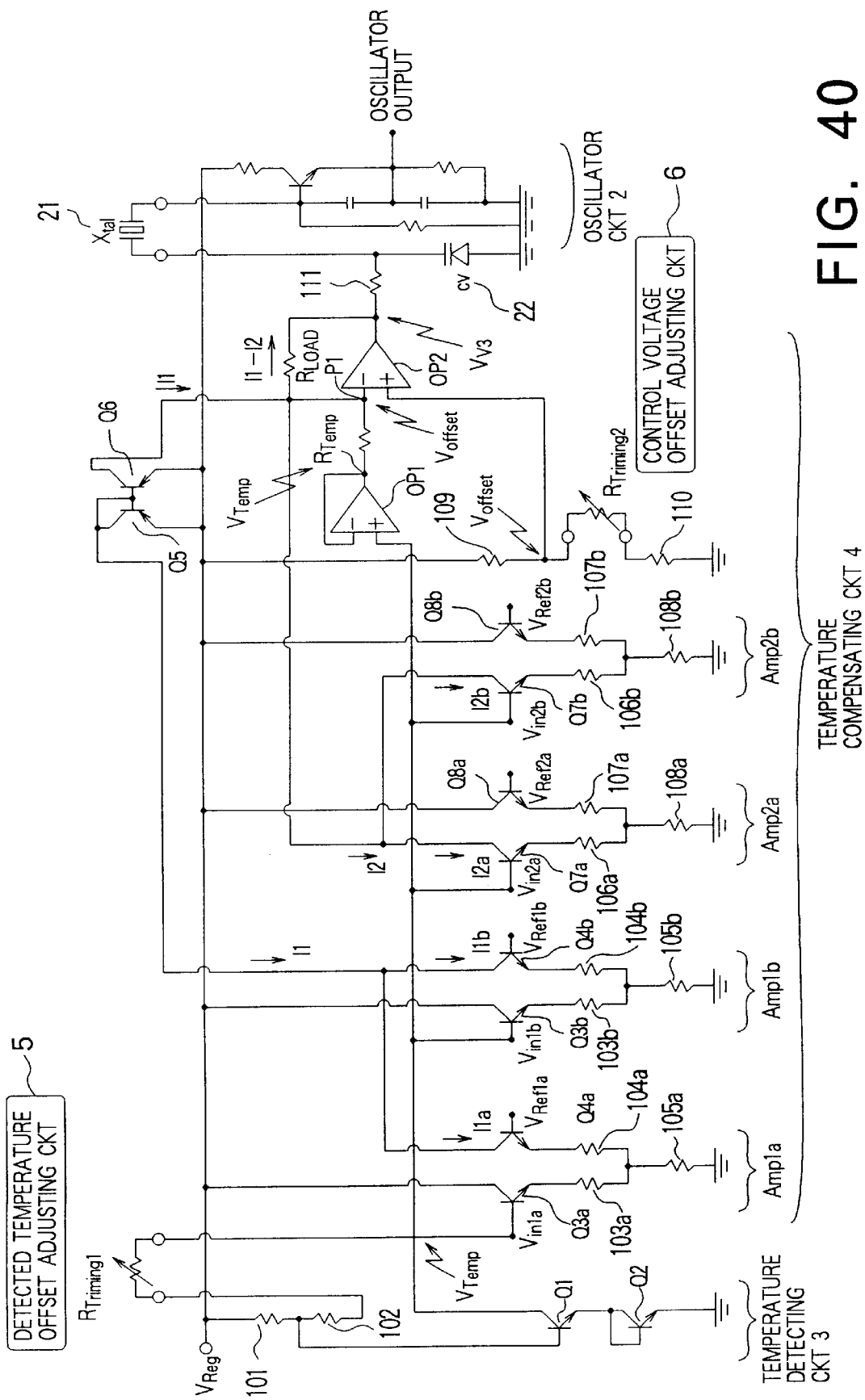
FIG. 40 is a circuit diagram of a temperature-compensated quartz oscillator as a modification of the second embodiment.

Referring to FIG. 40, modification of the second embodiment is illustrated.

As described above, each of the first and the second differential amplifiers Amp1 and Amp2 can be formed by a plurality of differential amplifiers as desired.

It will be understood that the temperature-compensated quartz oscillator of this invention can be implemented as an integrated circuit (IC).

As described above, according to this invention, it is possible to provide the temperature-compensated quartz oscillator capable of compensating the variation of the oscillation frequency depending upon the temperature-frequency characteristic of the quartz resonator by the use of analog processing without using an expensive apparatus.

According to this invention, since the number of the temperature detecting elements forming the temperature detecting circuit can be selected as desired, operation by a low voltage is possible.

According to this invention, fine adjustment of circuit operation can be made after completion of circuit design by the use of the detected temperature offset adjusting element and the control voltage offset adjusting element each of which may comprise the variable resistor.

Therefore, it is possible to provide the temperature-compensated quartz oscillator which is capable of reducing the cost in selecting the elements and which can be mass produced.

According to this invention, since the structure can be implemented as the IC, it is possible to provide a small-sized temperature-compensated quartz resonator.

What is claimed is:

1. A crystal oscillator of a temperature compensating type, comprising:

an oscillator circuit comprising:

a crystal element having a natural resonant frequency, said natural resonant frequency being a particular frequency at a particular temperature and having a frequency-temperature response where said natural resonant frequency is accompanied with a frequency fluctuation from said particular frequency which is dependent on a temperature variation from said particular temperature so that a temperature response of a frequency fluctuation ratio to said particular frequency is represented by a first cubic curve of a positive cubic coefficient with an inflection point at said particular temperature, and a varicap diode having a variable capacitance controlled by a varicap control voltage level of a varicap control signal applied thereto, said variable capacitance of said varicap diode having a particular capacitance at a particular varicap control voltage level of said varicap control signal applied thereto and having a capacitance-voltage response such that said variable capacitance varies in inverse proportion to said varicap control voltage level varied, said oscillator circuit oscillating at an oscillating frequency generally determined by said natural resonant frequency and controlled by said varicap diode, and said oscillating frequency of said oscillator circuit having a predetermined frequency when said oscillation temperature is at a predetermined oscillation temperature and when said variable capacitance is at a predetermined capacitance, said oscillating frequency having a frequency-capacitance response where said oscillating frequency has a frequency deviation from said predetermined frequency in response to variation of said variable capacitance so that a frequency deviation rate to said predetermined frequency changes in inverse proportion to said variable capacitance varied;

a temperature detecting circuit comprising a temperature sensor disposed in the vicinity of said oscillator circuit, said temperature detecting circuit detecting, as an oscillation temperature, a temperature circumferential of said oscillator circuit to produce, as a detected voltage signal, a voltage signal with a voltage level, as a detection voltage level, said detected voltage signal having a predetermined detection voltage level when said oscillation temperature is at said predetermined oscillation temperature, said detected voltage signal varying, in said detection voltage level, in linear proportion to variation of said oscillation temperature; and a temperature compensating circuit for analog-processing said detecting voltage signal to produce said varicap control signal having said varicap control voltage level, said varicap control signal having a predetermined varicap control voltage level when said oscillation temperature is at said predetermined oscillation temperature, said varicap control voltage level varying in response to said detected voltage signal varying dependent on variation of said oscillation temperature along a second cubic curve of a predetermined negative cubic coefficient with an inflection point at the predetermined varicap control voltage level, said varicap control signal being applied to said varicap diode to thereby control said variable capacitance to maintain said oscillating frequency stable against variation of said oscillation temperature;

said temperature compensating circuit comprising:

converted voltage signal producing means responsive to said detected voltage signal for producing a converted voltage signal, said converted voltage signal being a zero voltage level when said detected voltage signal represents said predetermined detection voltage level, and having a converted voltage level varying in response to variation of said detection voltage level of said detected voltage signal along a third cubic curve having no turning value with an inflection point at said zero voltage level;

basic voltage signal producing means for producing a basic voltage signal, said basic voltage signal having a predetermined basic voltage level corresponding to said predetermined varicap control voltage level;

set voltage signal producing means for producing a set voltage signal, said set voltage signal having a set voltage level equal to said predetermined detection voltage level; and varicap control signal producing means for comparing said detected voltage signal and said set voltage signal to produce a voltage difference signal, and combining said voltage differential signal, said converted voltage signal, and said basic voltage signal to produce said varicap control signal which has, as said predetermined varicap control voltage level, a voltage level equal to the basic voltage at said predetermined oscillation temperature.

2. A crystal oscillator as claimed in claim 1, wherein said varicap control signal producing means includes said converted voltage signal and said voltage difference signal before being combined with said basic voltage signal, in order to make said varicap control signal have said predetermined negative cubic coefficient.

3. A crystal oscillator as claimed in claim 1, wherein said converted voltage level varies along said third cubic curve which has a positive curve coefficient.

4. A crystal oscillator as claimed in claim 1, wherein said converted voltage level varies along said third cubic curve which has a negative cubic coefficient.

5. A crystal oscillator as claimed in claim 4, wherein said converted voltage signal producing means comprises:

a first differential amplifier comprising first and second transistors having individual first and second bases serving as two input terminals, said first base being supplied with a first reference voltage signal of a voltage level lower than said predetermined detection voltage level while said second base being supplied with said detected voltage signal, said first transistor having a first collector through which a first collector current flows;

a second differential amplifier comprising third and fourth transistors with individual third and fourth bases serving as two input terminals of the second differential amplifier, said third base being supplied with a second reference voltage signal of a voltage level higher than said predetermined detection voltage level while said fourth base bing supplied with said detected voltage signal, said fourth transistor having a second collector through which a second collector current flows;

current combining means connected to said first and said second collector of the first and the fourth transistors for combining said first and second collector current by subtracting said second collector current from said first collector current to produce a current combination signal, said current combination signal having a current level varying corresponding to said converted voltage signal; and a current-to-voltage conversion resistor responsive to said current combination signal for producing said converted voltage signal.

6. A crystal oscillator as claimed in claim 5, wherein said current combining means comprises a current mirror circuit having at least two transistors.

7. A crystal oscillator as claimed in claim 5, wherein said temperature detecting circuit produces said detected voltage signal having said detection voltage level varying along a straight line having a negative linear coefficient in response to variation of said oscillation temperature.

8. A crystal oscillator as claimed in claim 7, wherein said temperature detecting circuit is adjusted so that said predetermined detection voltage level is equal to said predetermined varicap control voltage level.

9. A crystal oscillator as claimed in claim 8, wherein said basic voltage signal producing means may also serve as said set voltage signal producing means so that said basic voltage signal also provides said set voltage signal.

10. A crystal oscillator as claimed in claim 9, wherein said varicap control signal producing means comprises:

first signal combining means for combining said converted voltage signal, said detected voltage signal and said basic voltage signal such that said converted voltage level is subtracted from said predetermined basic voltage level and said detected voltage level is further subtracted from an antecedent subtracted resultant, to produce a first combined voltage signal;

signal amplifying means for amplifying said first combined voltage signal with a predetermined amplification factor inherent thereto, to produce an amplified voltage signal representative of an amplified voltage level; and second signal combining means for combining said basic voltage signal and said amplified voltage signal such that said predetermined basic voltage level is added to said amplified voltage level, to produce a second combined voltage signal as said varicap control signal.

11. A crystal oscillator as claimed in claim 9, wherein said varicap control signal producing means comprises:

first signal combining means for combining said converted voltage signal and said detected voltage signal such that said converted voltage level is added to said detected voltage level, to produce a first combined voltage signal; and an inverted amplifier comprising a first and a second resistor and an operational amplifier, said operational amplifier having an output terminal to produce said varicap control signal, an inverting input terminal connected to the output terminal through the first resistor, said inverting input terminal being connected to the second resistor and being supplied with said first combined voltage signal through the second resistor, and a non-inverting input terminal supplied with said basic voltage signal.

12. A crystal oscillator as claimed in claim 9, wherein said varicap control signal producing means comprises:

first signal combining means for combining said basic voltage signal and said detected voltage signal such that said detected voltage level is subtracted from said predetermined basic voltage level, to produce a first combined voltage signal;

signal amplifying means for amplifying said first combined voltage signal with a predetermined amplification factor inherent thereto, to produce an amplified voltage signal representative of an amplified voltage level; and second signal combining means for combining said converted voltage signal, said basic voltage signal, and said amplified voltage signal such that said predetermined basic voltage level is added to said amplified voltage level followed by subtracting said converted voltage level therefrom, to produce a second combined voltage signal as said varicap control signal.

13. A crystal oscillator as claimed in claim 9, wherein said varicap control signal producing means comprises:

an inverted amplifier comprising a first and a second resistor and an operational amplifier, said operational amplifier having an output terminal to produce an amplified voltage signal representative of an amplified voltage level, an inverting input terminal connected to the output terminal through the first resistor, said inverting input terminal being connected to the second resistor and being supplied with said detected voltage signal through the second resistor, and a non-inverting input terminal supplied with said basic voltage signal; and signal combining means for combining said converted voltage signal and said amplified voltage signal such that said converted voltage level is subtracted from said amplified voltage level, to produce a combined voltage signal as said varicap control voltage signal.

14. A crystal oscillator as claimed in claim 13, wherein said first resistor also serves as a current-to-voltage conversion resistor.

15. A crystal oscillator as claimed in claim 9, further comprising:

a stabilized power supply circuit for supplying a constant voltage; and a detected temperature offset adjusting circuit connected to said stabilized power supply circuit and to said temperature detecting circuit, and comprising a detected temperature offset adjusting element for adjusting said predetermined detection voltage level to said predetermined basic voltage level.

16. A crystal oscillator as claimed in claim 15, wherein said detected temperature offset adjusting element comprises a variable resistor.

17. A crystal oscillator as claim in claim 1, further comprising:

a stabilized power supply circuit for supplying a constant voltage; and a control voltage offset adjusting circuit connected to said stabilized power supply circuit and to said basic voltage signal producing means, and comprising a control voltage offset adjusting element for adjusting said predetermined basic voltage level to said predetermined varicap control voltage level.

18. A crystal oscillator as claimed in claim 17, wherein said control voltage offset adjusting element comprises a variable resistor.

19. A crystal oscillator as claimed in claim 5, further comprising:

a stabilized power supply circuit for supplying a constant voltage; and reference voltage producing means connected to said stabilized power supply circuit and to said first and said second differential amplifiers, for producing a first and a second reference voltage as said first and said second reference voltage signals into said first and said second differential amplifiers, respectively.

20. A crystal oscillator as claimed in claim 19, wherein said reference voltage producing means comprises a voltage dividing circuit comprising at least three resistors and being connected between said stabilized power supply circuit and ground to produce at least two different voltages one of which has a greater voltage level and is used as said second reference voltage while another one of which has a smaller voltage level and is used as said first reference voltage.

21. A crystal oscillator as claimed in claim 20, wherein at least one of said at least three resistors comprises a variable resistor.

* * * * *